United States Patent
Endo et al.

(10) Patent No.: US 9,882,550 B2
(45) Date of Patent: Jan. 30, 2018

(54) WIRELESS POWER TRANSMITTING APPARATUS AND WIRELESS POWER SUPPLY SYSTEM

(71) Applicant: ADVANTEST CORPORATION, Tokyo (JP)

(72) Inventors: Yuki Endo, Tokyo (JP); Yasuo Furukawa, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 532 days.

(21) Appl. No.: 14/502,426

(22) Filed: Sep. 30, 2014

(65) Prior Publication Data

US 2015/0015087 A1    Jan. 15, 2015

Related U.S. Application Data

(63) Continuation of application No. PCT/JP2013/001667, filed on Mar. 13, 2013.

(30) Foreign Application Priority Data

Apr. 2, 2012  (JP) ................................. 2012-084333

(51) Int. Cl.
*H03J 7/04* (2006.01)
*H02J 50/10* (2016.01)
(Continued)

(52) U.S. Cl.
CPC ................ *H03J 7/04* (2013.01); *H01F 38/14* (2013.01); *H02J 5/005* (2013.01); *H02J 17/00* (2013.01);
(Continued)

(58) Field of Classification Search
CPC .... H03J 7/04; H02J 50/10; H02J 5/005; H02J 17/00; H01F 38/14; H04B 5/0037; H04B 5/0081
See application file for complete search history.

(56) References Cited

U.S. PATENT DOCUMENTS

| | | | |
|---|---|---|---|
| 6,176,433 B1 | 1/2001 | Uesaka et al. | |
| 2008/0116846 A1* | 5/2008 | Greenfeld | H02J 7/025 320/108 |

(Continued)

FOREIGN PATENT DOCUMENTS

| | | |
|---|---|---|
| JP | 8-263609 | 10/1996 |
| JP | 9-212606 | 8/1997 |

(Continued)

OTHER PUBLICATIONS

Karalis, A., et al. "Efficient wireless non-radiative mid-range energy transfer." Annals of Physics. vol. 323, Jan. 2008, pp. 34-48.

(Continued)

*Primary Examiner* — Jared Fureman
*Assistant Examiner* — James Evans
(74) *Attorney, Agent, or Firm* — Cantor Colburn LLP

(57) ABSTRACT

A wireless power transmitting apparatus transmits an electric power signal comprising any one from among an electric field, a magnetic field, and an electromagnetic field to a wireless power receiving apparatus. A reflector coil is arranged at a distance from a radiation coil. A driving power supply supplies a driving current to the radiation coil. A first phase control circuit controls the phase of the current that flows through the reflector coil so as to stabilize, to a predetermined value, the phase difference between the current that flows through the reflector coil and the current that flows through the radiation coil.

12 Claims, 33 Drawing Sheets

(51) Int. Cl.
H01F 38/14 (2006.01)
H02J 17/00 (2006.01)
H04B 5/00 (2006.01)
H02J 5/00 (2016.01)

(52) U.S. Cl.
CPC ............ H02J 50/10 (2016.02); H04B 5/0037 (2013.01); H04B 5/0081 (2013.01)

(56) References Cited

U.S. PATENT DOCUMENTS

| 2011/0281535 | A1* | 11/2011 | Low | H02J 7/025 |
| | | | | 455/129 |
| 2012/0086281 | A1* | 4/2012 | Kanno | H02J 5/005 |
| | | | | 307/82 |
| 2012/0235502 | A1* | 9/2012 | Kesler | H03H 7/40 |
| | | | | 307/104 |

FOREIGN PATENT DOCUMENTS

| JP | 11-32452 | 2/1999 |
| JP | 2007-311986 | 11/2007 |
| JP | 2009-201594 | 9/2009 |

OTHER PUBLICATIONS

International Search Report for the corresponding PCT Application No. PCT/JP2013/001667 with English translation.
International Preliminary Examination Report on Patentability (I) with Written Opinion of ISA for the corresponding PCT Application No. PCT/JP2013/001667 with an English translation.
Office Action dated Jan. 27, 2015 for related JP Office Action 2012-084333 and its English translation.

* cited by examiner

COMPARISON TECHNIQUE

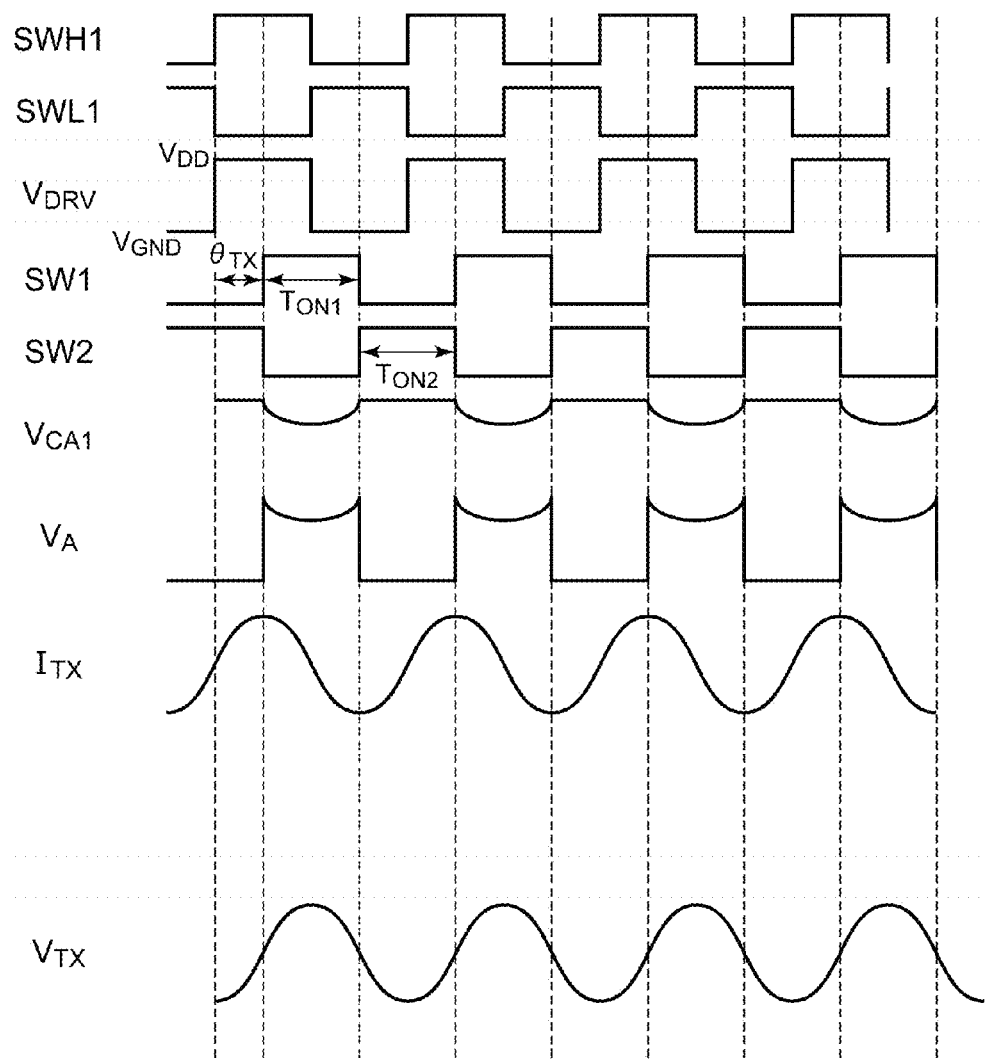

2d

2e

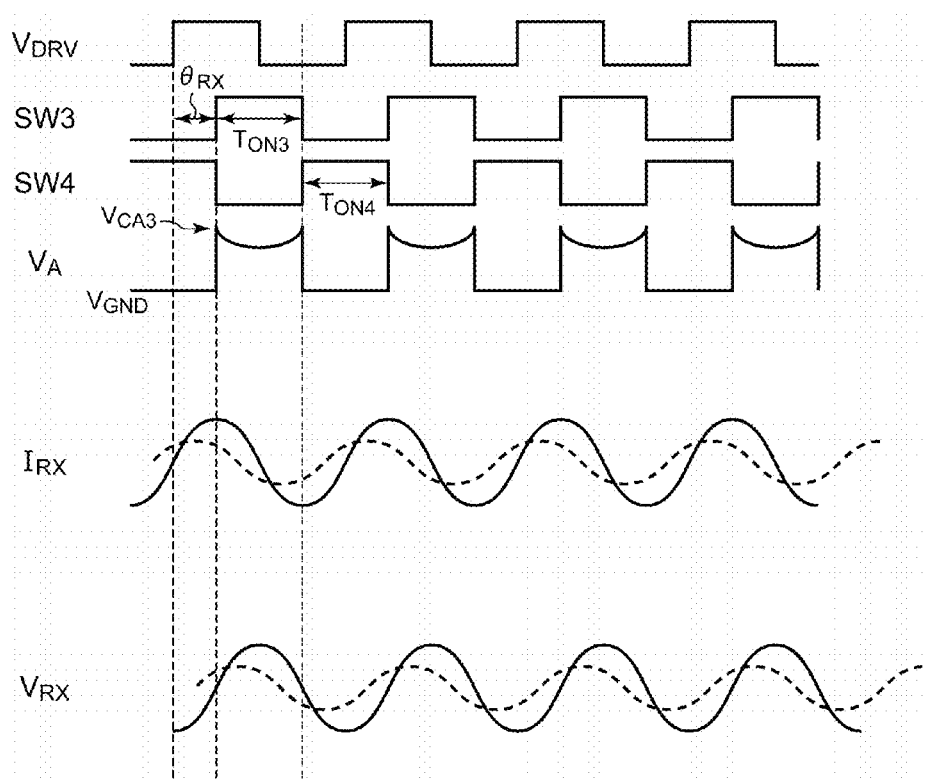

4a

4b

4d

4e

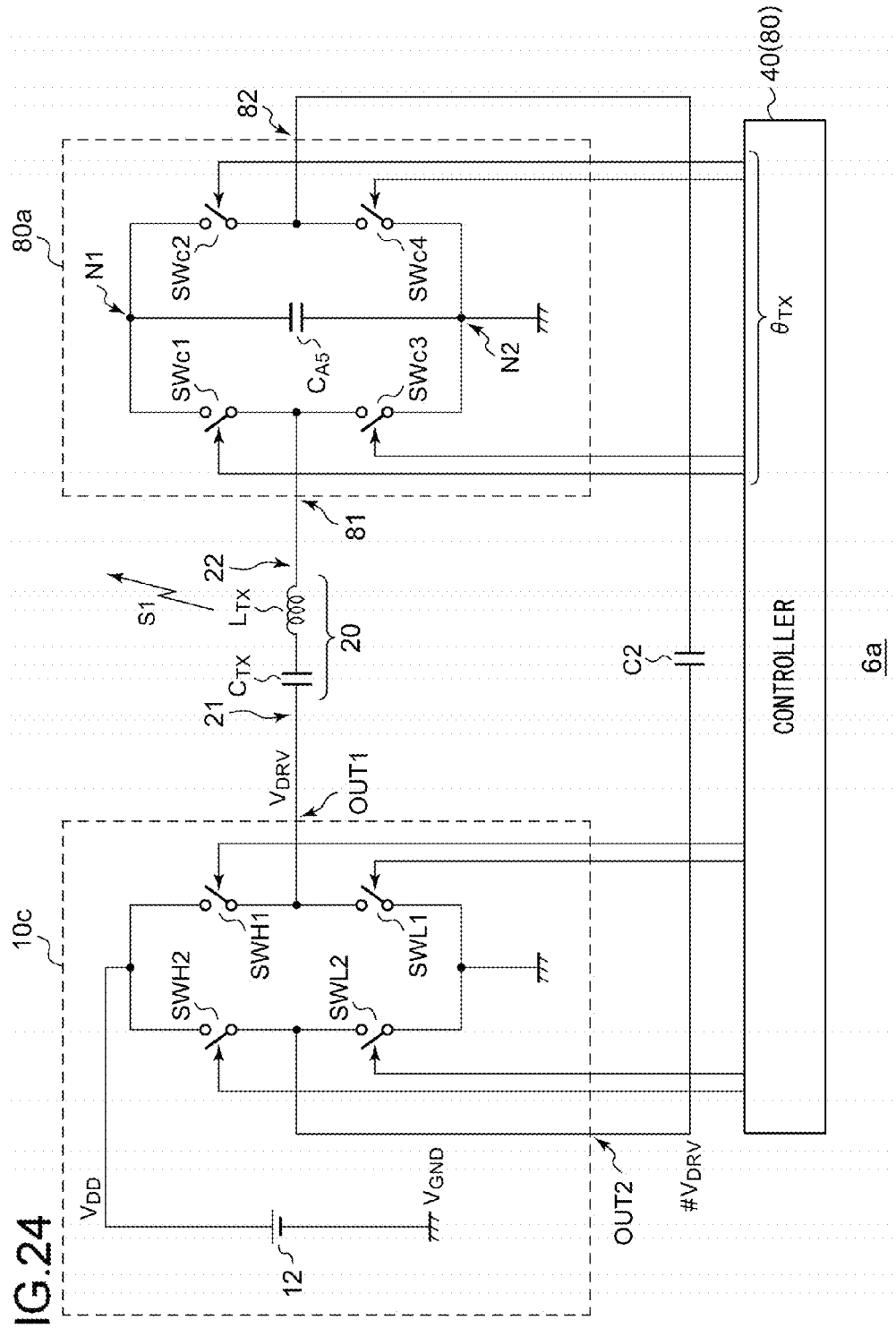

WIRELESS POWER TRANSMITTING APPARATUS AND WIRELESS POWER SUPPLY SYSTEM

CROSS-REFERENCE TO RELATED APPLICATIONS

This application is a Continuation of International Patent Application No. PCT/JP2013/001667, filed on Mar. 13, 2013, which claims priority to Japanese Patent Application No. 2012-084333 filed on Apr. 2, 2012, the disclosures of which are hereby incorporated by reference in their entireties.

BACKGROUND OF THE INVENTION

1. Field of the Invention

The present invention relates to a wireless power supply technique.

2. Description of the Related Art

In recent years, wireless (contactless) power transmission has been receiving attention as a power supply technique for electronic devices such as cellular phone terminals, laptop computers, etc., or for electric vehicles. Wireless power transmission can be classified into three principal methods using an electromagnetic induction, an electromagnetic wave reception, and an electric field/magnetic field resonance.

The electromagnetic induction method is employed to supply electric power at a short range (several cm or less), which enables electric power of several hundred watts to be transmitted in a band that is equal to or lower than several hundred kHz. The power use efficiency thereof is on the order of 60% to 98%. In a case in which electric power is to be supplied over a relatively long range of several meters or more, the electromagnetic wave reception method is employed. The electromagnetic wave reception method allows electric power of several watts or less to be transmitted in a band between medium waves and microwaves. However, the power use efficiency thereof is small. The electric field/magnetic field resonance method has been receiving attention as a method for supplying electric power with relatively high efficiency at a middle range on the order of several meters. Rerated techniques have been disclosed in "A. Karalis, J. D. Joannopoulos, M. Soljacic, "Efficient wireless non-radiative mid-range energy transfer" ANNALS of PHYSICS Vol. 323, January 2008, pp. 34-48", for example.

FIG. 1 is a diagram showing a wireless power supply system according to a comparison technique. The wireless power supply system 1r includes a wireless power transmitting apparatus 2r and a wireless power receiving apparatus 4r. The wireless power transmitting apparatus 2r includes a transmission coil $L_{TX}$, a resonance capacitor $C_{TX}$, and an AC power supply 10r. The wireless power receiving apparatus 4r includes a reception coil $L_{RX}$, a resonance capacitor $C_{RX}$, and a load 70.

In such a wireless power supply system 1r, in order to efficiently supply power, there is a need to satisfy the condition for resonance in the wireless power transmitting apparatus 2r and the wireless power receiving apparatus 4r.

In such a wireless power supply system 1r, the transmission coil $L_{TX}$ and the reception coil $L_{RX}$ are each configured as a solenoid coil, a spiral coil (loop coil), or the like. The magnetic field (electric field or electromagnetic field) generated by such a coil is symmetrical with respect to the coil face. However, in many applications, the power receiving apparatus 4r is arranged on only one side of the coil face. In this case, in order to suppress interference with other electronic devices, such an arrangement is preferably configured to damp the magnetic field on the side on which the wireless power receiving apparatus 4r is not arranged. Such a damping function is important from the viewpoint of protecting the human body. As an approach for damping the magnetic field on the other side of the coil face, an arrangement is conceivable in which a magnetic sheet is arranged on one side of the coil so as to provide a magnetic bypass effect. However, an electric power signal employed in wireless power transmission has a frequency on the order of several hundreds of kHz to 10 MHz. There is no known magnetic material having sufficient magnetic permeability and small energy loss in this frequency band.

SUMMARY OF THE INVENTION

The present invention has been made in order to solve such a problem. Accordingly, it is an exemplary purpose of an embodiment of the present invention to provide a technique for damping a magnetic field, electric field, or electromagnetic field on one face of the coil.

An embodiment of the present invention relates to a wireless power transmitting apparatus which transmits an electric power signal comprising any one from among an electric field, a magnetic field, and an electromagnetic field to a wireless power receiving apparatus. The wireless power transmitting apparatus comprises: a radiation coil; a reflector coil arranged at a distance from the radiation coil; a driving power supply that supplies a driving current to the radiation coil; and a first phase control circuit that controls the phase of a current that flows through the reflector coil so as to stabilize the phase difference between the current that flows through the reflector coil and a current that flows through the radiation coil.

With such an embodiment, controlling the phase difference between the current that flows through the radiation coil and the current that flows through the reflector coil is none other than controlling the phase of the magnetic field generated by the radiation coil and the phase of the magnetic field generated by the reflector coil. Thus, in a state in which the phase difference is optimized, on the side further above the coil face of the reflector coil, positive interference occurs between the magnetic field generated by the radiation coil and the magnetic field generated by the reflector coil. In contrast, in a space between the radiation coil and the reflector coil, negative interference occurs between them. This allows the magnetic field (electric field or electromagnetic field) generated by the radiation coil to be damped on the one side thereof.

Another embodiment of the present invention relates to a wireless power supply system. The wireless power supply system comprises the aforementioned wireless power transmitting apparatus and a wireless power receiving apparatus.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 4 is a waveform diagram showing the operation of the wireless power transmitting apparatus shown in FIG. 2;

FIG. 16 is a waveform diagram showing the operation of the wireless power receiving apparatus shown in FIG. 14;

FIG. 24 is a circuit diagram showing a configuration of a wireless power transmitting apparatus according to a first modification;

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

First Embodiment

[Wireless Power Transmitting Apparatus]

Figure 1:
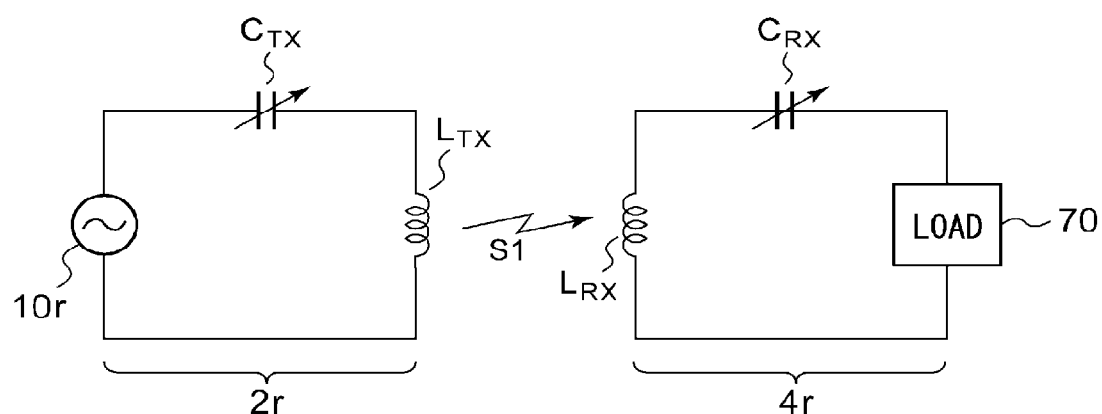
FIG. 1 is a diagram showing a wireless power supply system according to a comparison technique.
Figure 2:
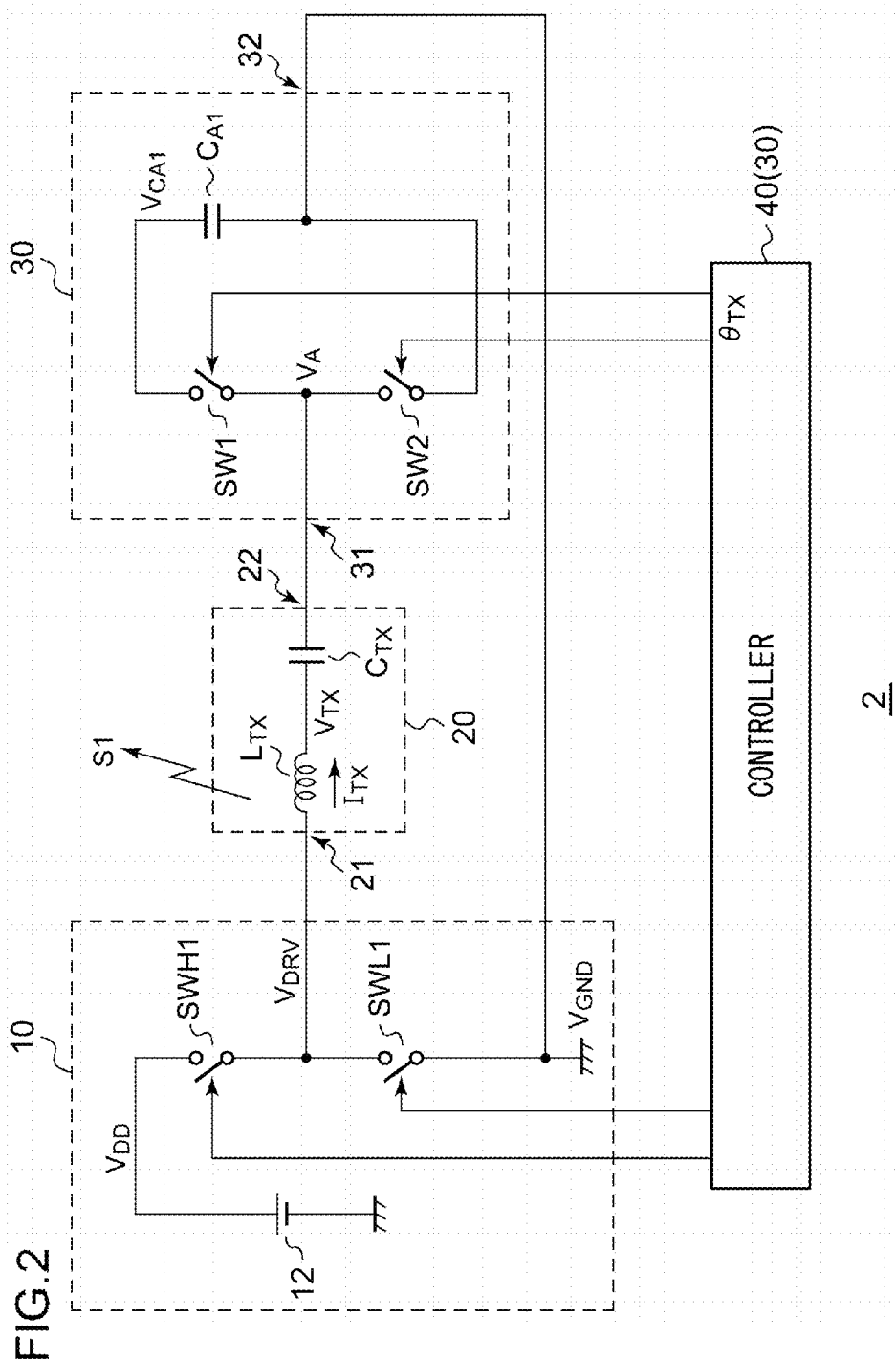
FIG. 2 is a circuit diagram showing a configuration of a wireless power transmitting apparatus according to a first embodiment.

FIG. 2 is a circuit diagram showing a configuration of a wireless power transmitting apparatus 2 according to a first embodiment. The wireless power transmitting apparatus 2 transmits an electric power signal S1 to a wireless power receiving apparatus (not shown). As such an electric power signal S1, the wireless power transmitting apparatus 2 uses the near-field components (electric field, magnetic field, or electromagnetic field) of electromagnetic waves that have not yet become radio waves.

The wireless power transmitting apparatus 2 includes a power supply 10, a transmission antenna 20, an automatic tuning assist circuit 30, and a first controller 40. The transmission antenna 20 includes a transmission coil $L_{TX}$ arranged between its first terminal 21 and its second terminal 22. A resonance capacitor $C_{TX}$ is arranged in series with the transmission coil $L_{TX}$. The resonance capacitor $C_{TX}$ and the transmission coil $L_{TX}$ may also be mutually exchanged.

The automatic tuning assist circuit 30 is coupled in series with the transmission antenna 20. The power supply 10 is applies an AC driving voltage $V_{DRV}$ having a predetermined transmission frequency $f_{TX}$ across a series circuit that comprises the transmission antenna 20 and the automatic tuning assist circuit 30. The driving voltage $V_{DRV}$ may have a desired AC waveform, examples of which include a rectangular waveform, a trapezoidal waveform, a sine waveform, and the like. With the present embodiment, the driving voltage $V_{DRV}$ is configured as a rectangular wave signal which swings between a first voltage level (power supply voltage $V_{DD}$) and a second voltage level (ground voltage $V_{GND}=0$ V).

The power supply 10 includes a DC power supply 12, a first high-side switch SWH1, and a first low-side switch SWL1. The DC power supply 12 generates a DC power supply voltage $V_{DD}$. The first high-side switch SWH1 and the first low-side switch SWL1 are sequentially connected in series between the output terminal of the DC power supply 12 and a fixed voltage terminal (ground terminal). The first controller 40 switches on and off the first high-side switch SWH1 and the first low-side switch SWL1 in a complementary manner, with a transmission frequency $f_{TX}$.

The automatic tuning assist circuit 30 includes a first terminal 31, a second terminal 32, a first switch SW1, a second switch SW2, and a first auxiliary capacitor $C_{A1}$.

The first switch SW1 and the first auxiliary capacitor $C_{A1}$ are arranged in series between the first terminal 31 and the second terminal 32. The first switch SW1 and the first auxiliary capacitor $C_{A1}$ may also be mutually exchanged. The second switch SW2 is arranged in parallel with the first switch SW1 and the first auxiliary capacitor $C_{A1}$ between the first terminal 31 and the second terminal 32. The first auxiliary capacitor $C_{A1}$ is preferably configured to have a sufficiently greater capacitance than that of the resonance capacitor $C_{TX}$.

The first controller 40 switches on and off the first switch SW1 and the second switch SW2 in a complementary manner, with the same frequency $f_{TX}$ as that of the driving voltage $V_{DRV}$, and with a predetermined phase difference $\theta_{TX}$ with respect to the driving voltage $V_{DRV}$. The phase difference $\theta_{TX}$ may preferably be set to a value in the vicinity of +90 degrees or otherwise −90 degrees (270 degrees). That is to say, a part of the first controller 40 functions as a component of the automatic tuning assist circuit 30.

Figure 3A:
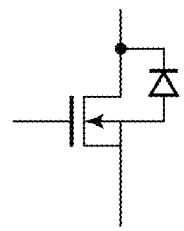
FIGS. 3A through 3F are diagrams each showing an example configuration of a switch employing MOSFETs.
Figure 3B:
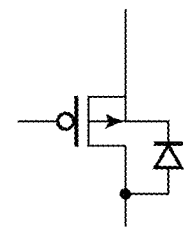
Figure 3C:
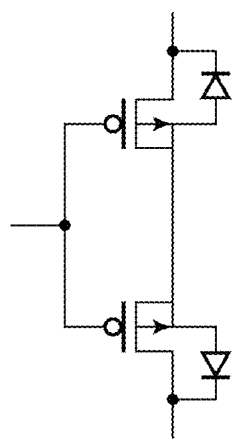
Figure 3D:
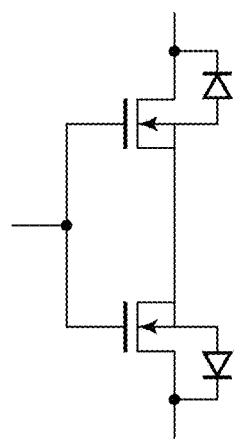
Figure 3E:
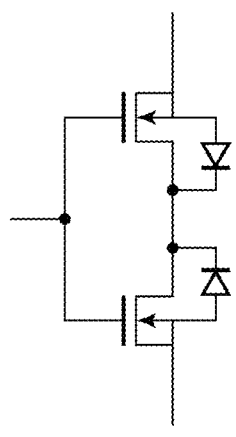
Figure 3F:
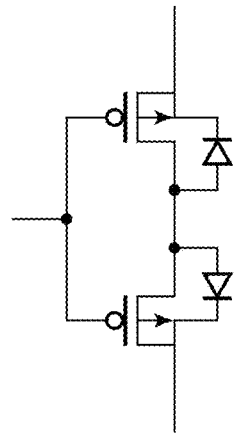

The first switch SW1 and the second switch SW2 are each configured employing a MOSFET (Metal Oxide Semiconductor Field Effect Transistor), IGBT (Insulated Gate Bipolar Transistor), bipolar transistor, or the like. FIGS. 3A and 3B are diagrams each showing an example configuration of a switch employing a MOSFET.

FIG. 3A shows a configuration of the switch employing an N-channel MOSFET. FIG. 3B shows a configuration of the switch employing a P-channel MOSFET. In a case in which the back gate of the MOSFET is connected to its source, the body diode that forms between the back gate and the drain is in the connection state regardless of the gate voltage. Thus, such a switch configured as a single MOSFET is not capable of blocking a current that flows in one particular direction. In the present specification, such a switch will be referred to as a "uni-directional switch".

The switches shown in FIGS. 3C through 3F each comprise two N-channel MOSFETs or otherwise two P-channel MOSFETs connected such that their body diodes are connected in reverse directions (back-to-back connection). With the switches shown in FIGS. 3C through 3F, in the off state, no current flows in either direction. In the present specification, such a switch will be referred to as a "bi-directional switch".

With the present embodiment, the switches SW1 and SW2 may each be configured as a uni-directional switch or otherwise a bi-directional switch. It should be noted that, in a case in which the switches SW1 and SW2 are each configured as a uni-directional switch, there is a need to pay attention to their switching phases. Detailed description thereof will be made later.

The above is the configuration of the wireless power transmitting apparatus 2. Next, description will be made regarding the operation thereof.

Let us consider an arrangement in which the switches SW1 and SW2 are each configured as a bi-directional switch which is capable of blocking a current in both directions in the off state.

FIG. 4 shows waveform diagrams each showing the operation of the wireless power transmitting apparatus 2 shown in FIG. 2. FIG. 4 shows, in the following order beginning from the top, the voltage at the first high-side switch SWH1, the voltage at the first low-side switch SWL1, the driving voltage $V_{DRV}$, the voltage at the first switch SW1, the voltage at the second switch SW2, the voltage $V_{CA1}$ at the first auxiliary capacitor $C_{A1}$, the voltage $V_A$ at the first terminal 31, the resonance current $I_{TX}$ that flows through the transmission antenna 20, and the resonance voltage $V_{TX}$ that develops across a series circuit including the transmission coil $L_{TX}$ and the resonance capacitor $C_{TX}$. In the waveform diagram for each switch, the high level represents the on state, and the low level represents the off state. It should be noted that FIG. 4 shows the waveforms of the resonance current $I_{TX}$ and the resonance voltage $V_{TX}$ obtained after a sufficient time has elapsed after the automatic tuning assist circuit 30 starts to operate.

As shown in FIG. 4, by switching on and off the first high-side switch SWH1 and the first low-side switch SWL1 in a complementary manner, such an arrangement is capable of generating the driving voltage $V_{DRV}$ having a rectangular waveform. The driving voltage $V_{DRV}$ thus generated is applied across a series circuit including the transmission antenna 20 and the automatic tuning assist circuit 30. The first controller 40 switches on and off the first switch SW1 and the second switch SW2 in a complementary manner, with the same frequency as that of the driving voltage $V_{DRV}$, and with a phase that is delayed by $\theta_{TX}$ (=90 degrees) with respect to the driving voltage $V_{DRV}$. The resonance current $I_{TX}$ flows to the first auxiliary capacitor $C_{A1}$ during the on time $T_{ON1}$ of the first switch SW1, and flows to the ground via the second switch SW2 during the on time $T_{ON2}$ of the second switch SW2. That is to say, the first auxiliary capacitor $C_{A1}$ is charged and discharged by means of the resonance current $I_{TX}$. As a result, the capacitor voltage $V_{CA1}$ develops at the first auxiliary capacitor $C_{A1}$.

Figure 5:
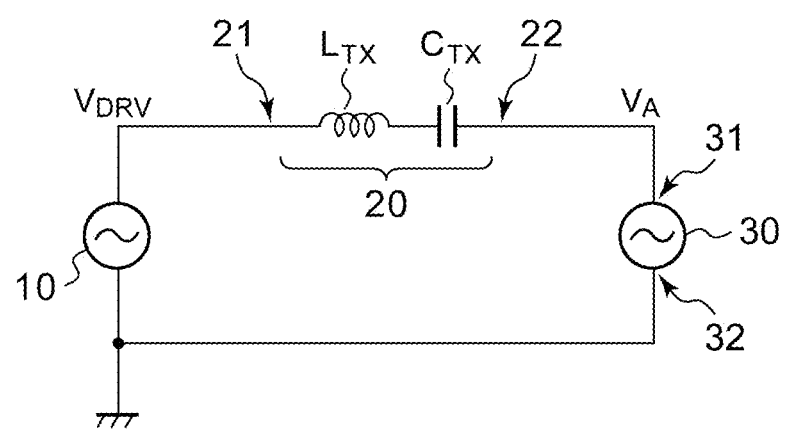
FIG. 5 is an equivalent circuit diagram of the wireless power transmitting apparatus shown in FIG. 2.

The automatic tuning assist circuit 30 applies a correction voltage $V_A$ to the second terminal 22 of the transmission antenna 20. During the on time $T_{ON1}$ of the first switch SW1, the first auxiliary capacitor voltage $V_{CA1}$ is used as the correction voltage $V_A$. On the other hand, during the on time $T_{ON2}$ of the second switch SW2, the ground voltage $V_{GND}$ is used as the correction voltage $V_A$. The automatic tuning assist circuit 30 can be regarded as a correction power supply configured to apply the correction voltage $V_A$ to the transmission antenna 20. FIG. 5 is an equivalent circuit diagram showing an equivalent circuit of the wireless power transmitting apparatus 2 shown in FIG. 2.

Figure 6A:
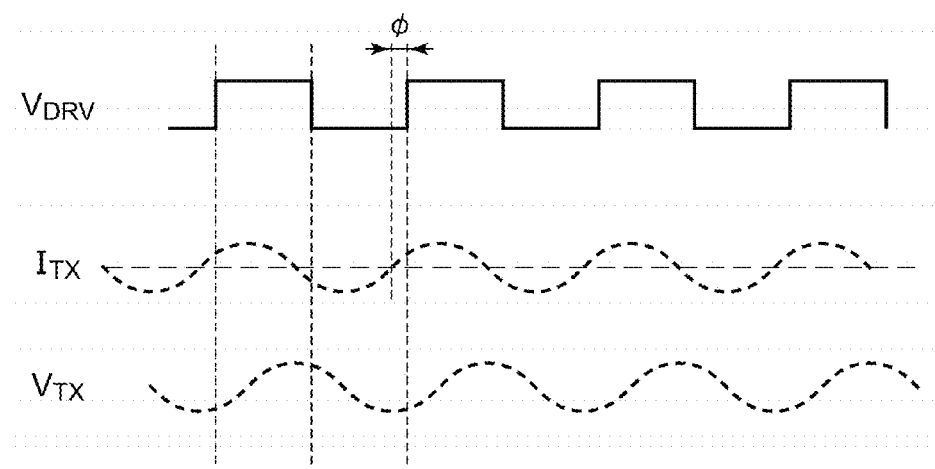
FIG. 6A is a waveform diagram showing a state in which an automatic tuning assist circuit does not operate.
Figure 6B:
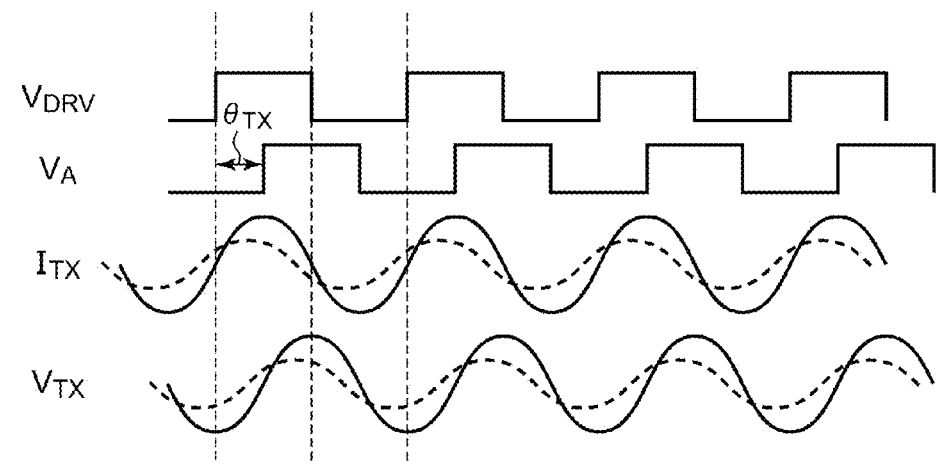
FIG. 6B is a waveform diagram showing a state in which the automatic tuning assist circuit operates.

FIG. 6A is a waveform diagram showing a state in which the automatic tuning assist circuit 30 does not operate, and FIG. 6B is a waveform diagram showing a state in which the automatic tuning assist circuit 30 operates.

First, description will be made with reference to FIG. 6A regarding the state in which the automatic tuning assist circuit 30 does not operate, i.e., a state in which the first switch SW1 is fixed to the off state, and the second switch SW2 is fixed to the on state. In this state, the correction voltage $V_A$ is fixed to the ground voltage $V_{GND}$. The impedance Z of the transmission antenna 20 is represented by the following Expression (1). The resonance frequency $f_c$ of the transmission antenna 20 is represented by the following Expression (2). The following Expressions (1) and (2) represent the impedance and the resonance frequency assuming that the resistance component is negligible. However, it is needless to say that, in actual circuits, the resistance component connected in series contributes to the circuit impedance.

$$Z = j\omega L_{TX} + 1/(j\omega C_{TX}) \quad (1)$$

$$f_c = 1/2\pi\sqrt{(L_{TX}C_{TX})} \quad (2)$$

In a case in which the frequency $f_{TX}$ of the driving voltage $V_{DRV}$ is higher than the resonance frequency $f_c$ ($f_{TX} > f_c$), the transmission antenna 20 functions as an inductor. In this case, the resonance current $I_{TX}$ that flows through the transmission antenna 20 has a phase which is delayed with respect to the phase of the driving voltage $V_{DRV}$. Conversely, in a case in which the frequency $f_{TX}$ of the driving voltage $V_{DRV}$ is lower than the resonance frequency $f_c$ ($f_{TX} < f_c$), the transmission antenna 20 functions as a capacitor. In this case, the resonance current $I_{TX}$ has a phase which is advanced with respect to the driving voltage $V_{DRV}$.

FIG. 6A shows a state in which $f_c > f_{TX}$. In this state, the resonance current $I_{TX}$ has a phase which is advanced by the phase difference $\varphi$ with respect to the driving voltage $V_{DRV}$. It should be noted that the phase difference $\varphi$ is not 90 degrees. This is because the resonance circuit includes a non-negligible resistance component (not shown) connected in series. In the non-resonant state, the impedance Z exhibits a high value, leading to a reduced amplitude of the resonance current $I_{TX}$. In this state, such an arrangement is not capable of transmitting a large amount of electric power.

Next, description will be made with reference to FIG. 6B regarding a case in which the automatic tuning assist circuit 30 operates.

In a case in which the automatic tuning assist circuit 30 operates, the correction voltage $V_A$ is applied to the transmission antenna 20 with a phase that is delayed by $\theta_{TX}$=90 degrees with respect to the driving voltage $V_{DRV}$. As a result, phase matching is obtained between the resonance current $I_{TX}$ and the driving voltage $V_{DRV}$, thereby providing a quasi-resonant state. In this state, the resonance current $I_{TX}$ has a greater amplitude than that in the non-resonant state.

Figure 7:
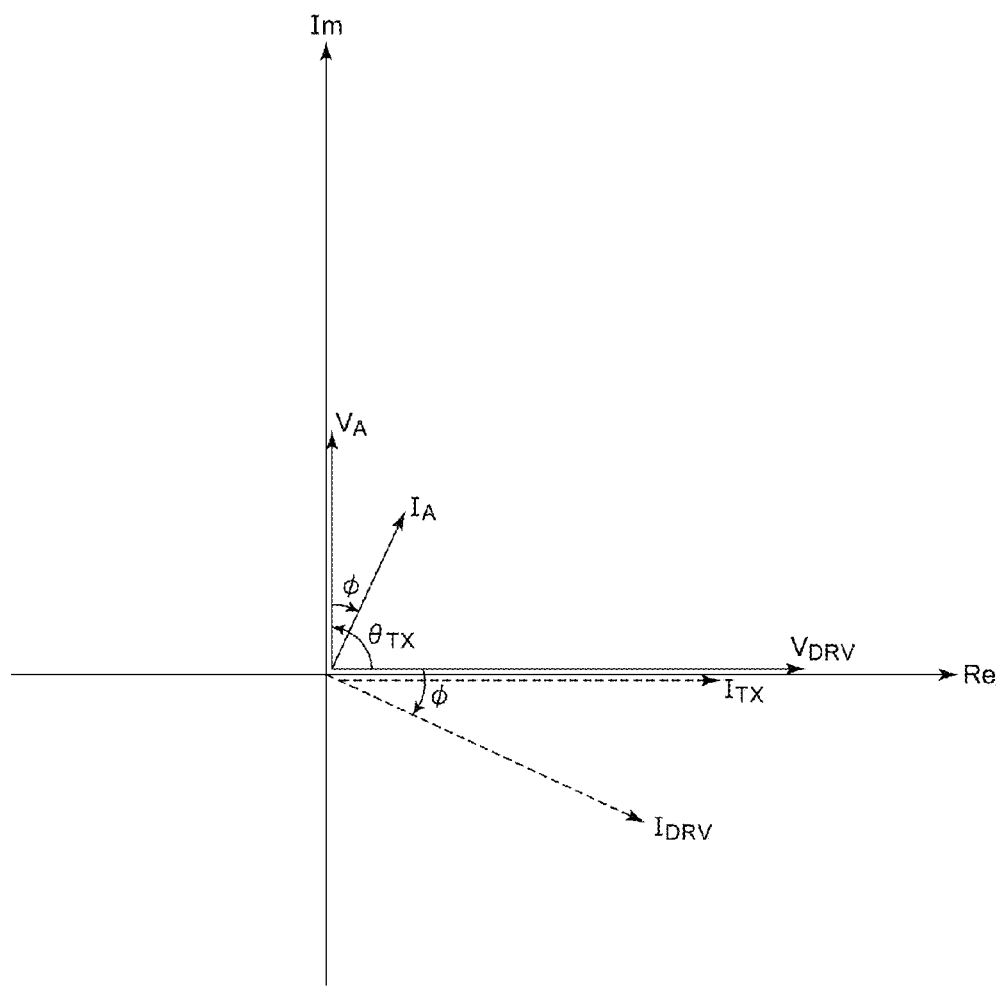
FIG. 7 is a phasor diagram for describing a quasi-resonant state provided by the automatic tuning assist circuit in a case in which $f_c < f_{TX}$.

FIG. 7 is a phasor diagram (vector diagram) for describing the quasi-resonant state provided by the automatic tuning assist circuit 30.

The phase of the driving voltage $V_{DRV}$ is 0 degrees. The phase of the correction voltage $V_A$ is $\theta_{TX}$=90 degrees. In a case in which $f_c < f_{TX}$, the current has a phase that is delayed by the phase difference $\varphi$ with respect to the voltage. Thus, the phase difference $\varphi$ exists between the driving voltage $V_{DRV}$ and the current component $I_{DRV}$. Furthermore, the phase difference $\varphi$ exists between the correction voltage $V_A$ and the current component $V_A$.

Based on the "principle of superposition", the resonance current $I_{TX}$ is configured as the sum of the current component $I_{DRV}$ induced by the driving voltage $V_{DRV}$ and the current component $I_A$ induced by the correction voltage $V_A$. There is a phase difference of $\theta_{TX}$ (=90 degrees) between the driving voltage $V_{DRV}$ and the correction voltage $V_A$. Accordingly, there is a phase difference of 90 degrees between the current components $I_{DRV}$ and $I_A$. Thus, by optimizing the amplitude of the correction voltage $V_A$, i.e., by optimizing the amplitude of the current component $I_A$, such an arrangement is capable of providing phase matching between the driving voltage $V_{DRV}$ (having a phase of 0 degrees) and a resultant current obtained by combining the two current components $I_{DRV}$ and $I_A$, i.e., the resonance current $I_{TX}$. That is to say, it can be clearly understood that such an arrangement provides a quasi-resonant state.

The wireless power transmitting apparatus 2 according to the embodiment is capable of automatically generating the correction voltage $V_A$ which provides the quasi-resonant state, which is an important excellent advantage of the wireless power transmitting apparatus 2 according to the embodiment.

Figure 8:
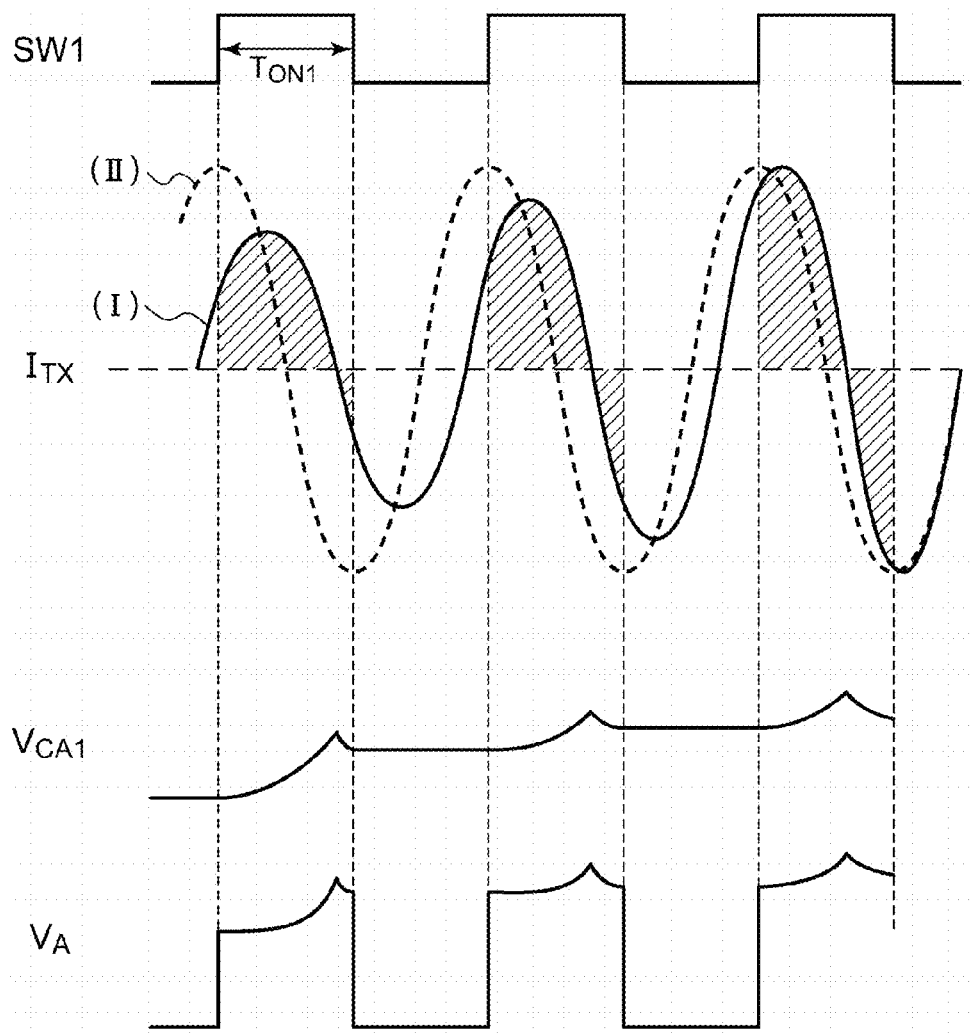
FIG. 8 is a diagram showing a resonance current in a non-resonant state and in a resonance state.

FIG. 8 is a diagram showing the resonance current $I_{TX}$ in the non-resonant state and in the resonance state. The waveform (I) represents the resonance current $I_{TX}$ in the non-resonant state. In the on time $T_{ON1}$ in which the switch SW1 is on, the first auxiliary capacitor $C_{A1}$ is charged and discharged by means of the resonance current $I_{TX}$. Specifically, the first auxiliary capacitor $C_{A1}$ is charged during a period in which the resonance current $I_{TX}$ is positive, and is discharged during a period in which the resonance current $I_{TX}$ is negative. As a result, in a case in which the period in which the resonance current $I_{TX}$ is positive is longer than the period in which the resonance current $I_{TX}$ is negative, the capacitor voltage $V_{CA1}$ rises. Otherwise, the capacitor voltage $V_{CA1}$ drops.

Let us say that the capacitor voltage $V_{CA1}$ rises in the on time $T_{ON1}$ of a certain cycle. In this case, the correction voltage $V_A$ is applied to the transmission antenna 20 according to the rising capacitor voltage $V_{CA1}$. This advances the phase of the resonance current $I_{TX}$ with respect to the resonance current $I_{TX}$ of the previous cycle. By repeatedly performing this processing, the capacitor voltage $V_{CA1}$ rises in increments of cycles, which gradually advances the phase of the resonance current $I_{TX}$. Eventually, the phase of the resonance current $I_{TX}$ shifts until it matches the phase of the driving voltage $V_{DRV}$ (resonance point). When the phase of the resonance current $I_{TX}$ exceeds the resonance point, the discharge current of the first auxiliary capacitor $C_{A1}$ becomes greater than its charging current, thereby providing a feedback control operation in the reverse direction. This reduces the capacitor voltage $V_{CA1}$, thereby returning the phase of the resonance current $I_{TX}$ to the resonance point. At the resonance point, such an arrangement provides a balance between the charging current and the discharging current of the first auxiliary capacitor $C_{A1}$ for each cycle, thereby providing an equilibrium state of the capacitor voltage $V_{CA1}$. In this state, a quasi-resonant state is maintained. As described above, with the wireless power transmitting apparatus 2 shown in FIG. 2, such an arrangement is capable of automatically generating the correction voltage $V_A$ that is required to provide the quasi-resonant state.

The above is the operation of the wireless power transmitting apparatus 2.

As described above, without adjusting the resonance frequency $f_c$ of the transmission antenna 20, the wireless power transmitting apparatus 2 is capable of automatically tuning the circuit state so as to provide the quasi-resonant state. In the wireless power transmission, the resonance frequency changes over time according to the position relation between the wireless power transmitting apparatus 2 and the wireless power receiving apparatus 4. The wireless power transmitting apparatus 2 is capable of following the change in the resonance frequency with high speed, thereby providing high-efficiency electric power transmission.

Furthermore, in a case in which a large amount of electric power is transmitted by means of wireless power transmission, a very high voltage develops between both ends of the resonance capacitor $C_{TX}$, which limits the use of a variable capacitor. With the wireless power transmitting apparatus 2, there is no need to adjust the capacitance of the resonance capacitor $C_{TX}$. Thus, such an arrangement does not require such a variable capacitor or the like, which is another advantage.

Description has been made above regarding a case in which the first switch SW1 is switched on and off with a phase that is delayed by $\theta_{TX}$ (=90 degrees) with respect to the phase of the switching of the first high-side switch SWH1. However, the phase difference $\theta_{TX}$ between the first switch SW1 and the first high-side switch SWH1 is not restricted to 90 degrees. Also, an arrangement may be made in which the phase difference $\theta_{TX}$ between the first switch SW1 and the first high-side switch SWH1 is set to 270 degrees (−90 degrees). In this case, the capacitor voltage $V_{CA1}$ is automatically adjusted such that it becomes a negative voltage.

That is to say, in a case in which $f_c < f_{TX}$, by setting the phase difference $\theta_{TX}$ to 90 degrees or otherwise 270 degrees, such an arrangement provides a quasi-resonant state.

Also, the phase difference $\theta_{TX}$ may be moved away from 90 degrees or 270 degrees. In this case, the phase difference $\theta_{TX}$ between the current components $I_{DRV}$ and $I_A$ does not match 90 degrees. However, even in such a case, the capacitor voltage $V_{CA1}$ is automatically adjusted such that the resultant resonance current $I_{TX}$ has a phase of 0 degrees. It should be noted that, as the phase difference $\theta_{TX}$ becomes closer to 90 degrees or otherwise 270 degrees, the required value of the amplitude of the current component $I_A$, i.e., the required absolute value of the capacitor voltage $V_{CA1}$, becomes smaller. This is an advantage in employing an arrangement in which the phase difference $\theta_{TX}$ is set to 90 degrees or otherwise 270 degrees.

It should be noted that, in a case in which $f_c < f_{TX}$, such an arrangement is capable of supporting the quasi-resonant state in which the phase difference $\theta_{TX}$ is set to 270 degrees only in a case in which the first switch SW1 and the second switch SW2 are each configured as a bi-directional switch. In other words, in a case in which the first switch SW1 and the second switch SW2 are each configured as a uni-directional switch, such an arrangement is not capable of supporting the quasi-resonant state in which the phase difference $\theta_{TX}$ is set to 270 degrees. This is because the current flows through the body diode. Thus, in a case in which the first switch SW1 and the second switch SW2 are each configured as a uni-directional switch, there is a need to switch on and off the first switch SW1 and the second switch SW2 with a phase such that no current flows through the body diodes which each function as an inversely conducting element.

The wireless power transmitting apparatus 2 automatically provides a quasi-resonant state not only in a case in which $f_c < f_{TX}$, but also in a case in which $f_c > f_{TX}$. In this case, the phase difference $\theta_{TX}$ is preferably set to 270 degrees (−90 degrees).

Figure 9:
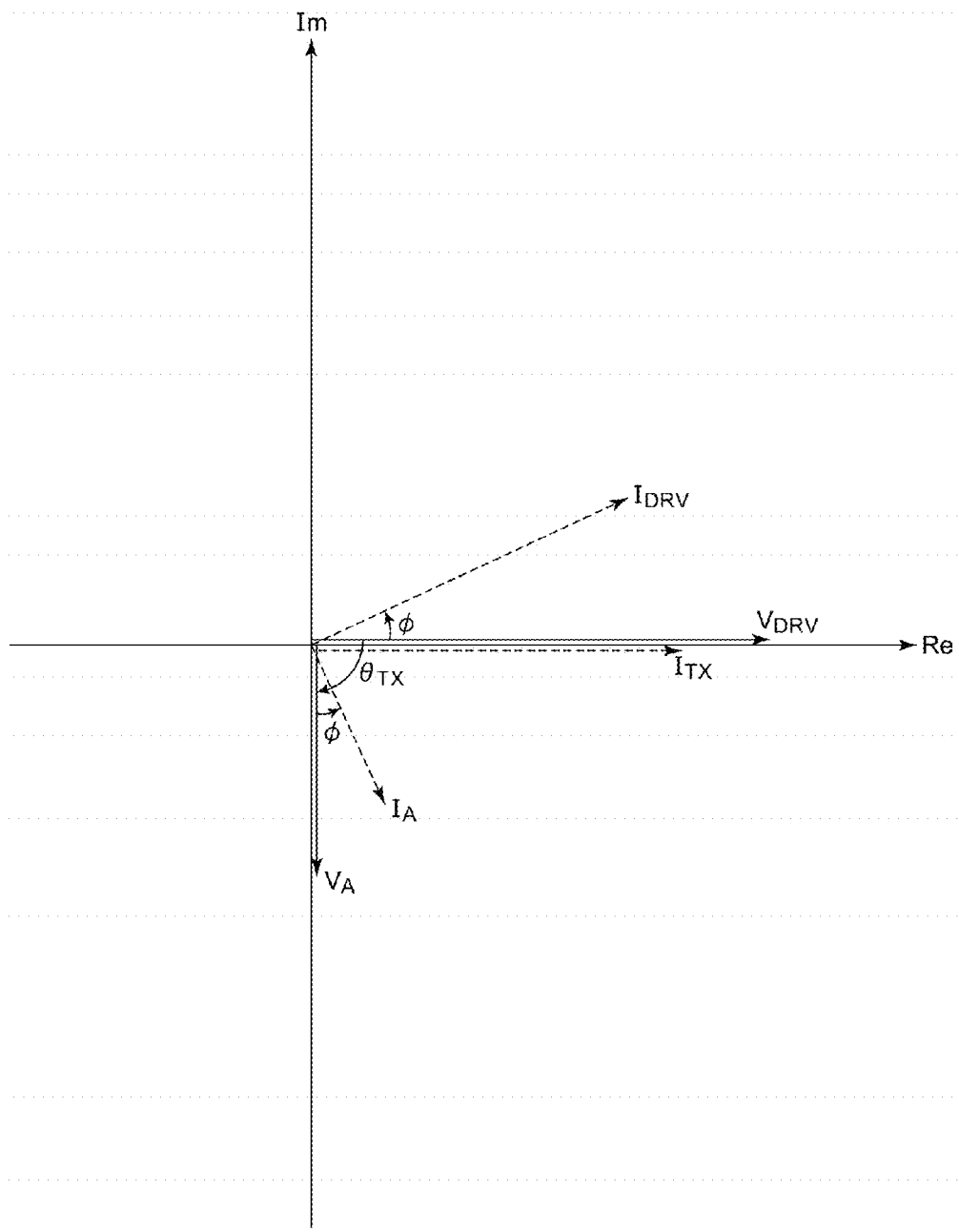
FIG. 9 is a phasor diagram for describing a quasi-resonant state provided by the automatic tuning assist circuit in a case in which $f_c > f_{TX}$.

FIG. 9 is a phasor diagram for describing a quasi-resonant state provided by the automatic tuning assist circuit 30 in a case in which $f_c > f_{TX}$. Description will be made below assuming that the driving voltage $V_{DRV}$ has a phase of 0 degrees, and the correction voltage $V_A$ has a phase $\theta_{TX}$ of 270 degrees (−90 degrees). In a case in which $f_c > f_{TX}$, the current has a phase which is advanced with respect to that of the voltage. Such an arrangement also provides a quasi-resonant state even in such a case.

It should be noted that, in a case in which $f_c > f_{TX}$, the phase difference $\theta_{TX}$ may be set to a value in the vicinity of 90 degrees. In this case, the capacitor voltage $V_{CA1}$ is automatically adjusted such that it becomes a negative voltage so as to provide a quasi-resonant state.

It should be noted that, in a case in which $f_c < f_{TX}$, such an arrangement is capable of supporting the quasi-resonant state in which the phase difference $\theta_{TX}$ is set to 90 degrees only in a case in which the first switch SW1 and the second switch SW2 are each configured as a bi-directional switch. In other words, in a case in which the first switch SW1 and the second switch SW2 are each configured as a uni-directional switch, such an arrangement is not capable of supporting the quasi-resonant state in which the phase difference $\theta_{TX}$ is set to 90 degrees. This is because the current flows through the body diode.

Next, description will be made regarding modifications of the wireless power transmitting apparatus 2. Each modification may be combined with any one of the other modifications, which is encompassed within the scope of the present invention.

Figure 10:
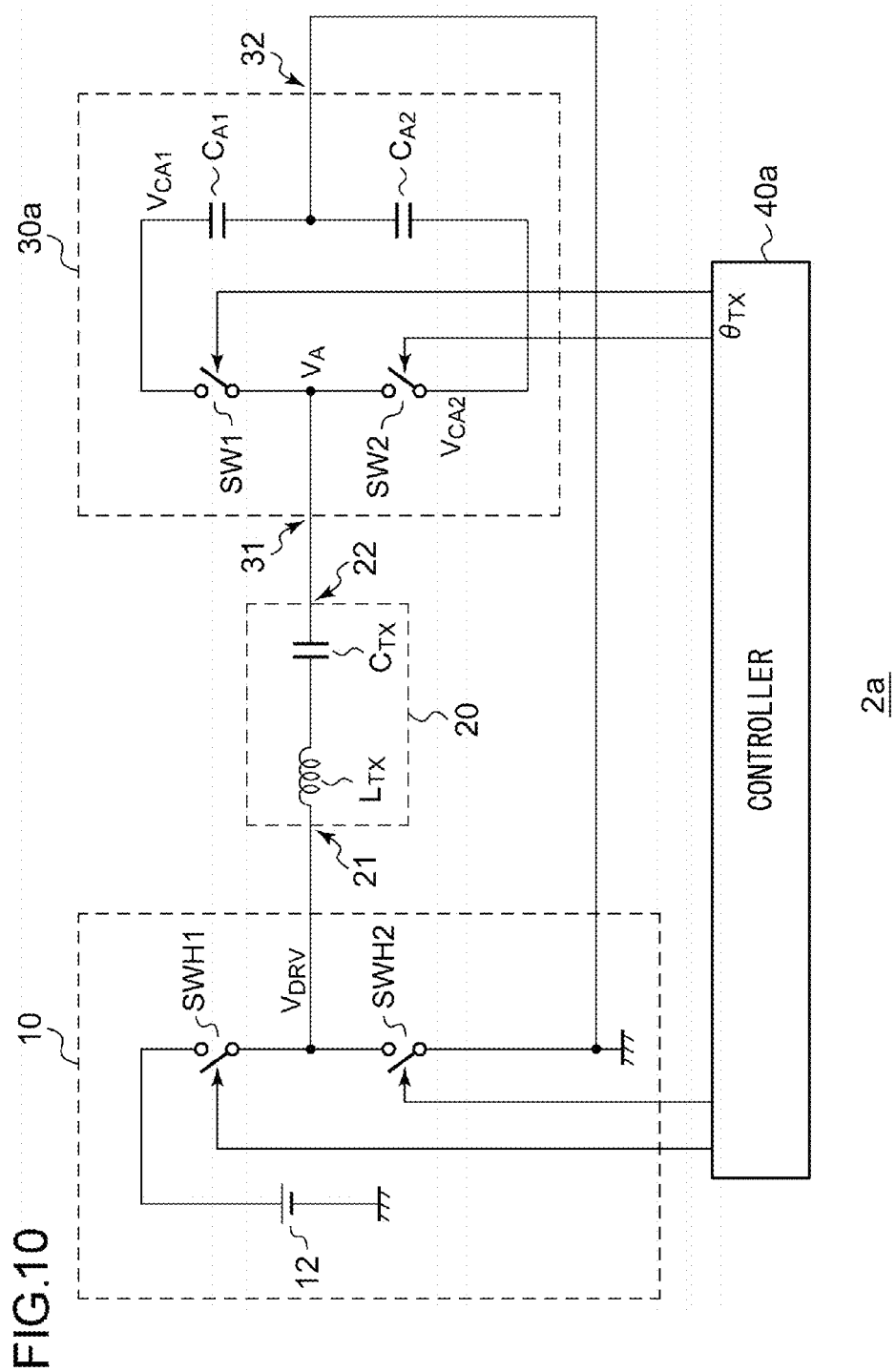
FIG. 10 is a circuit diagram showing a configuration of a wireless power transmitting apparatus according to a first modification.

FIG. 10 is a circuit diagram showing a configuration of a wireless power transmitting apparatus 2a according to a first modification. An automatic tuning assist circuit 30a includes a second auxiliary capacitor $C_{A2}$ between the first terminal 31 and the second terminal 32 such that it is connected in series with the second switch SW2.

With such a modification, during the on time $T_{ON1}$ of the first switch SW1, the correction voltage $V_A$ is set to the capacitor voltage $V_{CA1}$. During the on time $T_{ON2}$ of the second switch SW2, the correction voltage $V_A$ is set to the capacitor voltage $V_{CA2}$.

With the wireless power transmitting apparatus 2a, by optimizing the capacitor voltages $V_{CA1}$ and $V_{CA2}$, such an arrangement provides a quasi-resonant state both in the case in which $V_{TX} > f_c$ and in the case in which $V_{TX} < f_c$.

Figure 11:
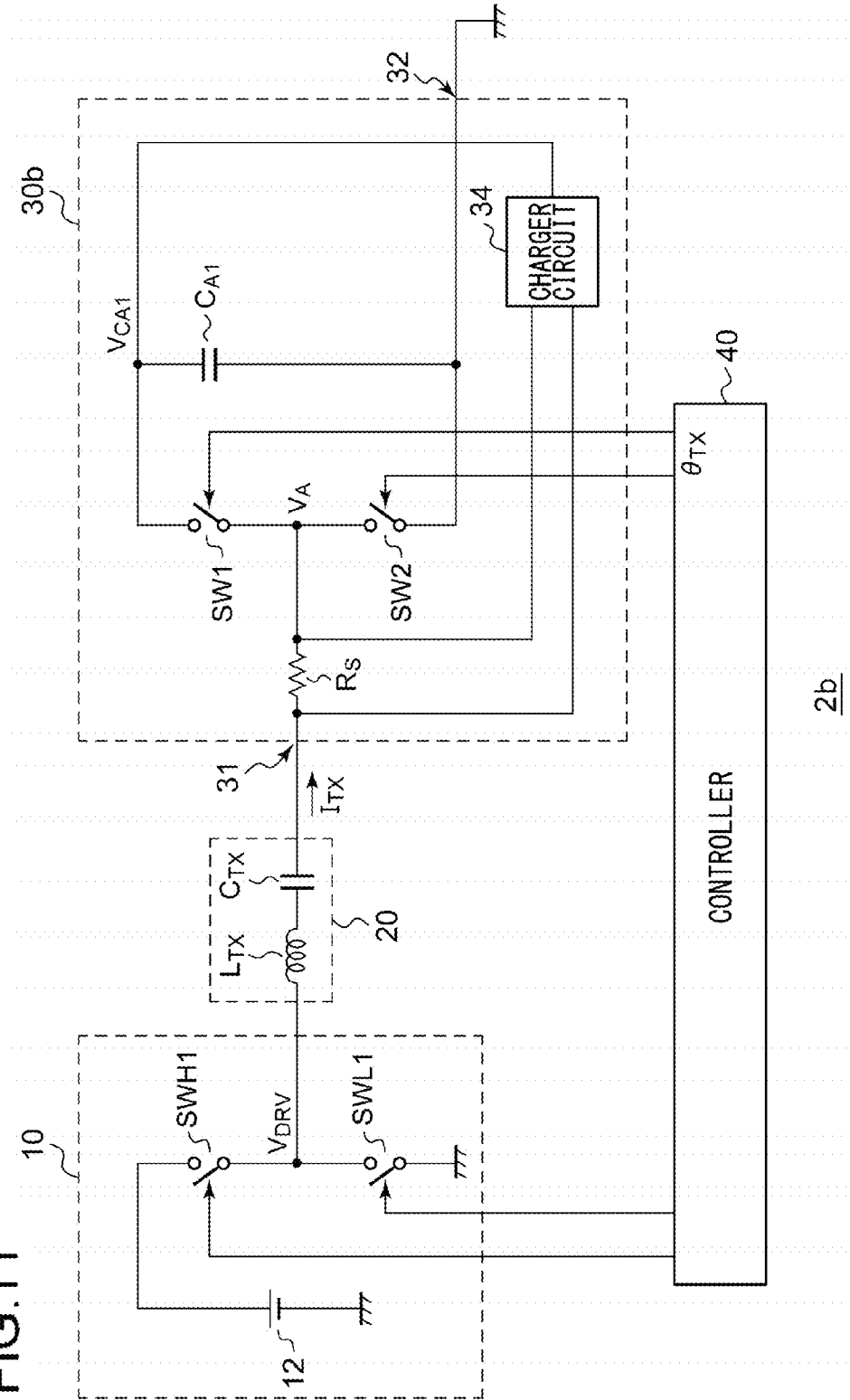
FIG. 11 is a circuit diagram showing a configuration of a wireless power transmitting apparatus according to a second modification.

FIG. 11 is a circuit diagram showing a configuration of a wireless power transmitting apparatus 2b according to a second modification. An automatic tuning assist circuit 30b includes a charger circuit 34 and a detection resistor Rs. The detection resistor Rs is arranged on a path of the resonance current $I_{TX}$. A detection voltage $V_S$ develops at the detection resistor Rs in proportion to the resonance current $I_{TX}$. The charger circuit 34 charges the first auxiliary capacitor $C_{A1}$ based on the detection voltage $V_S$ so as to provide a quasi-resonant state. As described above, the capacitor voltage $V_{CA1}$ automatically becomes the optimum level. In addition, by providing the charger circuit 34, such an arrangement provides a quasi-resonant state in a shorter period of time.

Figure 12:
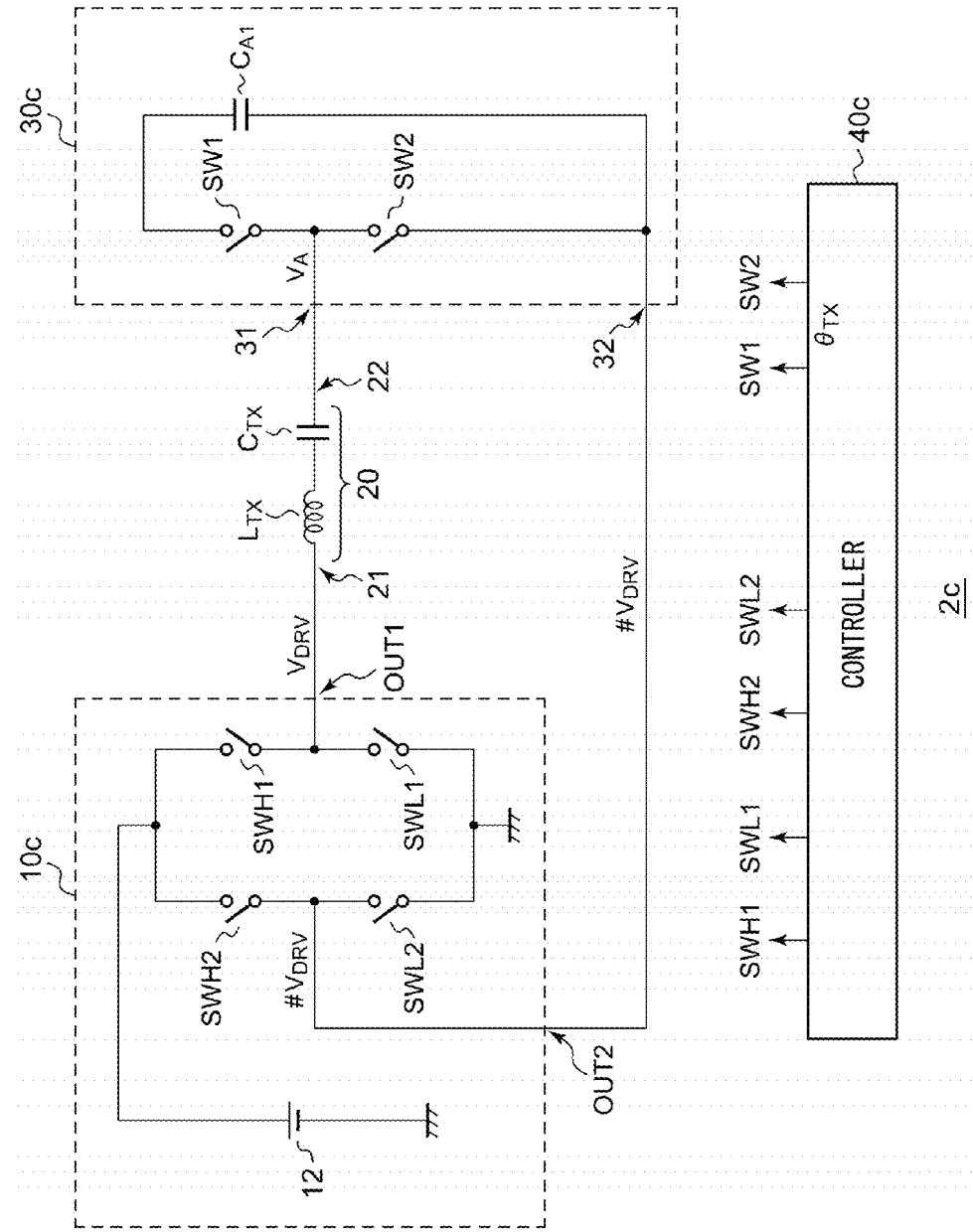
FIG. 12 is a circuit diagram showing a configuration of a wireless power transmitting apparatus according to a third modification.

FIG. 12 is a circuit diagram showing a configuration of a wireless power transmitting apparatus 2c according to a third modification. Description has been made in which the power supply is configured as a half-bridge circuit. In contrast, a power supply 10c shown in FIG. 12 is configured as an H-bridge circuit. A second high-side switch SWH2 and a second low-side switch SWL2 are sequentially connected in series between the output terminal of the power supply 12 and a fixed voltage terminal (ground terminal).

The first controller 40c repeatedly switches states between a state in which the pair of the high-side switch SWH1 and the second low-side switch SWL2 are turned on and a state in which the pair of the second high-side switch SWH2 and the first low-side switch SWL1 are turned on.

A driving voltage $V_{DRV}$ that develop at a connection node (first output terminal) OUT1 that connects the first high-side switch SWH1 and the first low-side switch SWL1 has a phase that is the reverse of the phase of a driving voltage #$V_{DRV}$ that develops at a connection node (second output terminal) OUT2 that connects the second high-side switch SWH2 and the second low-side switch SWL2. The transmission antenna 20 and an automatic tuning assist circuit 30c are coupled in series between the first output terminal OUT1 and the second output terminal OUT2.

With the wireless power transmitting apparatus 2c shown in FIG. 12, such an arrangement provides the same advantages as those provided by the wireless power transmitting apparatus described above.

Figure 13A:
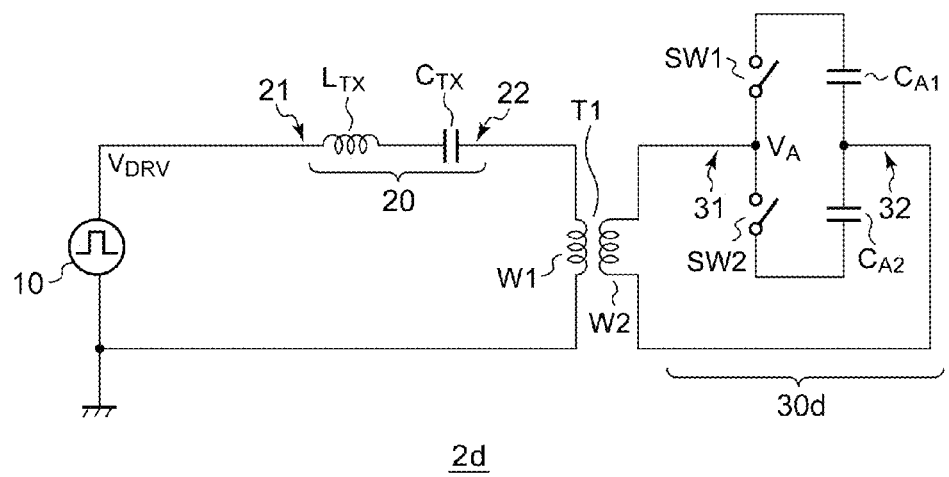
FIGS. 13A and 13B are circuit diagrams showing the configurations of wireless power transmitting apparatuses according to a fourth modification and a fifth modification, respectively.
Figure 13B:
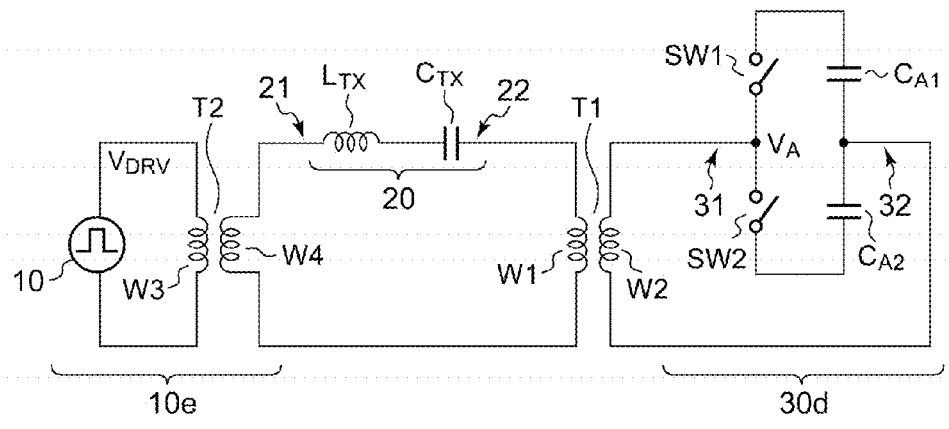

FIGS. 13A and 13B are circuit diagrams showing the configurations of wireless power transmitting apparatuses 2d and 2e according to a fourth modification and a fifth modification. The first controller 40 is omitted from the diagrams.

With the wireless power transmitting apparatus 2d shown in FIG. 13A, an automatic tuning assist circuit 30d is coupled in series with the transmission antenna 20 via a first transformer T1. Specifically, a secondary winding W2 of the first transformer T1 is arranged between the first terminal 31 and the second terminal 32, and a primary winding W1 of the first transformer T1 is arranged in series with the transmission antenna 20. The power supply 10 applies a driving voltage across a series circuit comprising the transmission antenna 20 and the primary winding W1.

With the wireless power transmitting apparatus 2d, energy is transmitted and received between the transmission antenna 20 and the automatic tuning assist circuit 30d via the transformer T1. Such an arrangement provides the same advantages as those provided by the wireless power transmitting apparatuses described above.

With an arrangement shown in FIG. 13B, the power supply 10 applies the driving voltage $V_{DRV}$ across a series circuit including the transmission antenna 20 and the automatic tuning assist circuit 30d via the second transformer T2. Specifically, the second winding W2 of the second transformer T2 is arranged in series with the transmission antenna 20. The power supply 10 applies the driving voltage $V_{DRV}$ between both ends of the primary winding W1 of the second transformer T2.

With the wireless power transmitting apparatus 2e, the driving voltage $V_{DRV}$ is applied across a series circuit including the transmission antenna 20 and the automatic tuning assist circuit 30d via the second transformer T2. Such an arrangement also provides the same advantages as those of the wireless power transmitting apparatuses described above. With the wireless power transmitting apparatus 2e, the first transformer T1 may be omitted. The power supply 10 shown in FIGS. 13A and 13B may be configured as an H-bridge circuit, a half-bridge circuit, or any other kind of power supply.

[Wireless Power Receiving Apparatus]

The automatic tuning assist circuit described above may also be employed in the wireless power receiving apparatus. Description will be made below regarding such a wireless power receiving apparatus.

Figure 14:
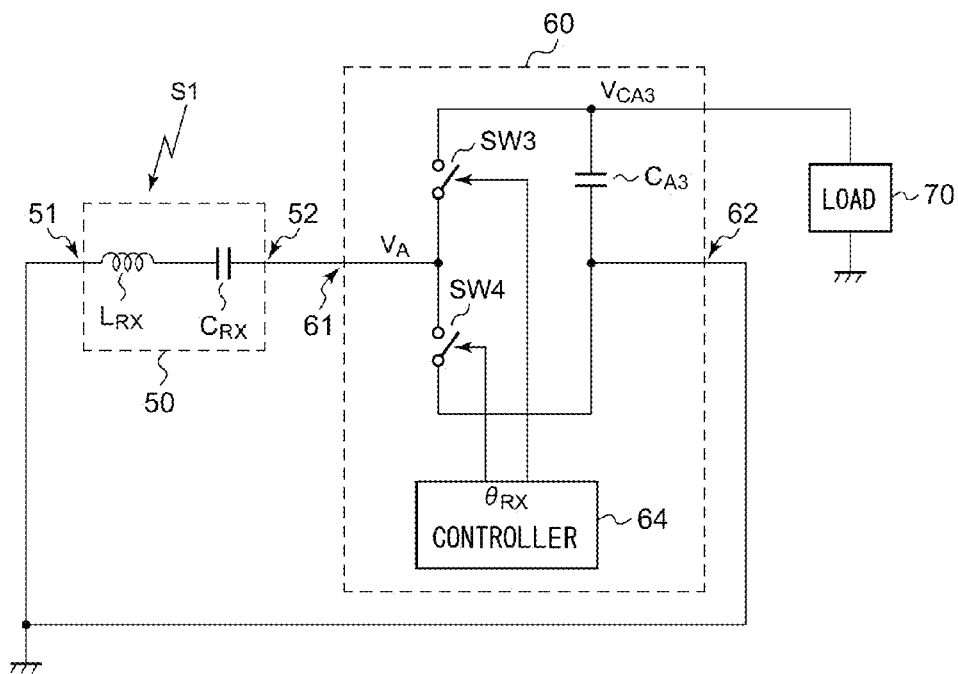
FIG. 14 is a circuit diagram showing a configuration of a wireless power receiving apparatus according to the first embodiment.

FIG. 14 is a circuit diagram showing a configuration of a wireless power receiving apparatus 4 according to the first embodiment. The wireless power receiving apparatus 4 receives the electric power signal S1 transmitted from the aforementioned wireless power transmitting apparatus or otherwise a wireless power transmitting apparatus having an entirely different configuration. The electric power signal S1 is configured using the near-field components (electric field, magnetic field, or electromagnetic field) of electromagnetic waves that have not yet become radio waves.

The wireless power receiving apparatus 4 includes a reception antenna 50, an automatic tuning assist circuit 60, and a load 70 to be supplied with electric power. The load 70 may include an unshown rectifier circuit, detector circuit, or the like, as a built-in component.

The reception antenna 50 includes a reception coil $L_{RX}$ and a resonance capacitor $C_{RX}$ arranged in series between a first terminal 51 and a second terminal 52.

The automatic tuning assist circuit 60 has the same configuration as that of the automatic tuning assist circuit 30 described above. Specifically, a third switch SW3 and a third auxiliary capacitor $C_{A3}$ are arranged between a first terminal 61 and a second terminal 62. Furthermore, a fourth switch SW4 is arranged between the first terminal 61 and the second terminal 62 such that it is connected in parallel with the third switch SW3 and the third auxiliary capacitor $C_{A3}$.

The second controller 64 switches on and off the third switch SW3 and the fourth switch SW4 in a complementary manner, with the same frequency as that of the electric power signal S1 and with a phase difference $\theta_{RX}$ with respect to the driving voltage ($V_{DRV}$) which is applied to the transmitter-side antenna. For example, the phase difference $\theta_{RX}$ is set to 180 degrees or otherwise 0 degrees.

The automatic tuning assist circuit 60 is coupled in series with the reception antenna 50. Furthermore, the load 70 to be supplied with electric power is connected to the third auxiliary capacitor $C_{A3}$.

Figure 15:
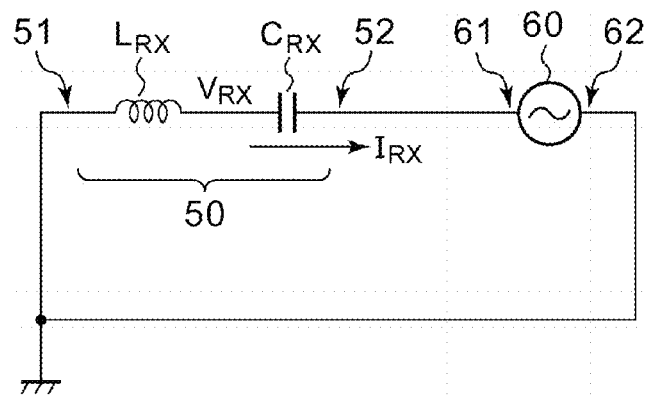
FIG. 15 is an equivalent circuit diagram of the wireless power transmitting apparatus shown in FIG. 14.

The above is the configuration of the wireless power receiving apparatus 4. Next, description will be made regarding the operation thereof. FIG. 15 is an equivalent circuit diagram showing an equivalent circuit configuration of the wireless power receiving apparatus 4 shown in FIG. 14. As with the automatic tuning assist circuit 30 of the wireless power transmitting apparatus 2, the automatic tuning assist circuit 60 can be regarded as a correction power supply configured to apply a correction voltage $V_A$ to the reception antenna 50. During the on time $T_{ON3}$ in which the third switch SW3 is turned on, the correction voltage $V_A$ is set to the voltage $V_{CA3}$ that develops at the third auxiliary capacitor $C_{A3}$. During the on time $T_{ON4}$ of the fourth switch SW4, the correction voltage $V_A$ is set to the ground voltage.

FIG. 16 is a waveform diagram showing the operation of the wireless power receiving apparatus 4 shown in FIG. 14. FIG. 16 shows, in the following order beginning from the top, the voltages applied to the third switch SW3 and the fourth switch SW4, the correction voltage $V_A$, the resonance current $I_{RX}$ that flows through the reception antenna 50, and the resonance voltage $V_{RX}$ that develops across a series circuit including the reception coil $L_{RX}$ and the resonance capacitor $C_{RX}$. In the waveform diagrams showing the voltages applied to the respective switches, the high-level state represents the on state, and the low-level state represents the off state. In the waveform diagrams showing the resonance current $I_{RX}$ and the resonance voltage $V_{RX}$, the solid line represents the waveform of a steady state (quasi-resonant state) after a sufficient period of time elapses after the automatic tuning assist circuit 60 starts to operate, and the broken line represents the waveform of a non-resonant state when the automatic tuning assist circuit 60 does not operate.

By switching on and off the third switch SW3 and the fourth switch SW4 in a complementary manner, with a phase $\theta_{RX}$ which is shifted by 180 degrees or otherwise 0 degrees with respect to the driving voltage $V_{DRV}$ of the wireless power transmitting apparatus side, such an arrangement charges or otherwise discharges the third auxiliary capacitor $C_{A3}$. Furthermore, by applying the correction voltage $V_A$ to the reception antenna 50, such an arrangement allows the resonance current $I_A$ to have a phase matching the phase of the driving voltage $V_{DRV}$ of the transmission side, thereby providing a quasi-resonant state.

In order to provide a quasi-resonant state, there is a need to switch on and off the third switch SW3 and the fourth switch SW4 with a suitable frequency $f_{TX}$ and with a suitable phase $\theta_{RX}$. In order to meet this requirement, the wireless power transmitting apparatus 2 may be configured to transmit the data which represents the frequency $f_{TX}$ and the phase $\theta_{RX}$ to the wireless power receiving apparatus 4. Also, the wireless power receiving apparatus 4 may be configured to sweep the phase $\theta_{RX}$ so as to detect the optimum phase $\theta_{RX}$.

The above is the operation of the wireless power receiving apparatus 4.

As described above, with the wireless power receiving apparatus 4 shown in FIG. 14, such an arrangement automatically provides a resonant state without a need to adjust the capacitance of the resonance capacitor $C_{RX}$.

Next, description will be made regarding modifications of the wireless power receiving apparatus 4.

Figure 17A:
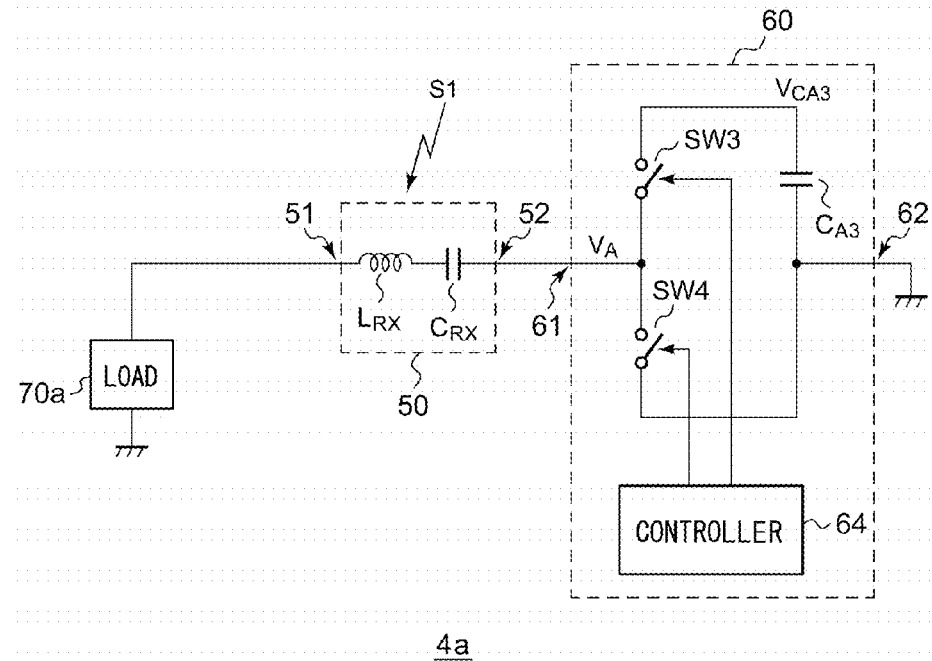
FIGS. 17A and 17B are circuit diagrams showing the configurations of wireless power receiving apparatuses according to a first modification and a second modification.
Figure 17B:
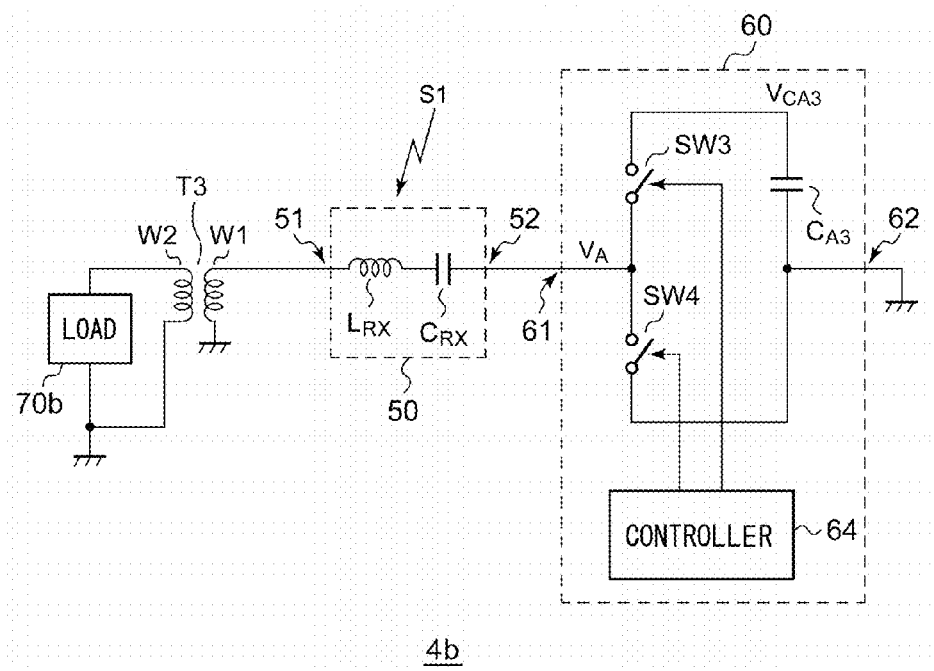

Description has been made with reference to FIG. 14 regarding an arrangement in which the load 70 is connected to the third auxiliary capacitor $C_{A3}$. Also, the load 70 may be connected to a different position. FIGS. 17A and 17B are circuit diagrams showing the configurations of wireless power receiving apparatuses according to a first modification and a second modification. With a wireless power receiving apparatus 4a shown in FIG. 17A, a load 70a is arranged in series with the reception antenna 50 and the automatic tuning assist circuit 60. Specifically, the load 70a is connected to a first terminal 51 of the reception antenna 50.

A wireless power reception apparatus 4b shown in FIG. 17B includes a third transformer T3 by means of which a load 70b is insulated from the reception antenna 50. The primary winding W1 of the third transformer T3 is connected in series with the reception antenna 50. The load 70b is connected to the secondary winding W2 of the third transformer T3.

In a case in which the load is connected in series with the reception antenna 50 as shown in FIGS. 17A and 17B, and in a case in which the load has a low impedance, such an arrangement has an advantage of a certain level of acquisition of electric power even without the adjustment by means of the automatic tuning assist circuit 60. However, such an arrangement has a disadvantage of a reduction of the Q-value of the reception antenna 50 due to the resistance component of the load. Thus, it is difficult for such an arrangement to acquire a large amount of electric power.

Conversely, in a case in which electric power is acquired from the automatic tuning assist circuit 60 as shown in FIG. 4, the Q-value of the reception antenna 50 is not reduced due to the load 70. Thus, such an arrangement is capable of acquiring a large amount of electric power even in a case in which the load 70 has a high impedance. However, in a case in which the load 70 has a very low impedance, such an arrangement has a problem of a reduction in the efficiency of the operation of the automatic tuning assist circuit 60.

Thus, the position of the load in the circuit is preferably determined giving consideration to the electric power to be transmitted, the impedance of the load, and so forth.

Figure 18:
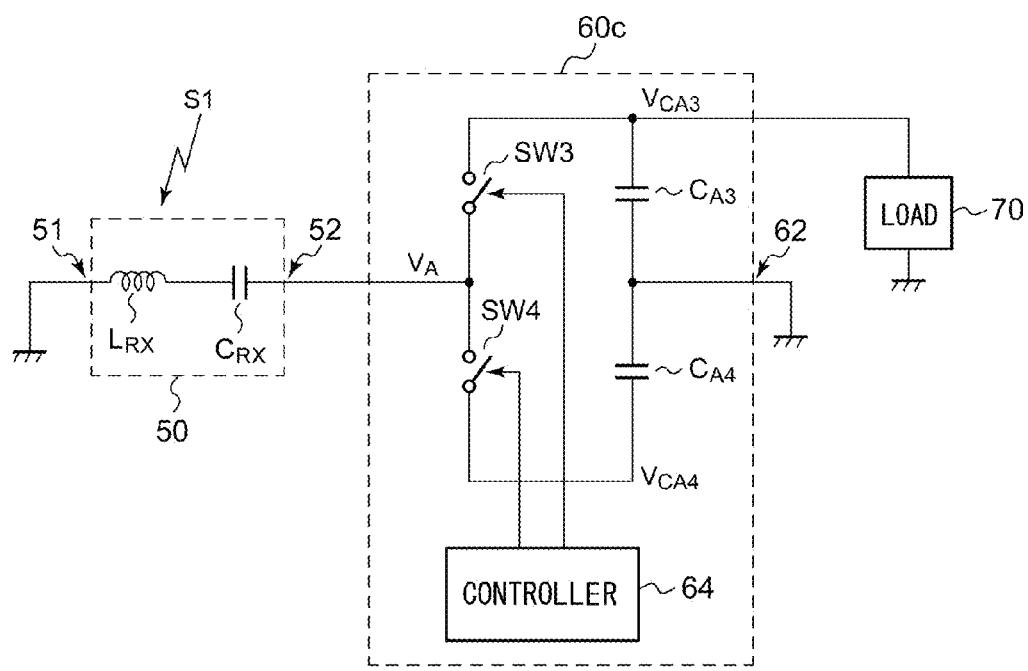
FIG. 18 is a circuit diagram showing a configuration of a wireless power receiving apparatus according to a third modification.

FIG. 18 is a circuit diagram showing a configuration of a wireless power receiving apparatus 4c according to a third modification. An automatic tuning assist circuit 60c further includes a fourth auxiliary capacitor $C_{A4}$ between the first terminal 61 and the second terminal 62 such that it is connected in series with the fourth switch SW4. The position of the load 70 is not restricted in particular.

With such a modification, during the on time $T_{ON3}$ of the third switch SW3, the correction voltage $V_A$ is set to the capacitor voltage $V_{CA3}$, and during the on time $T_{ON4}$ of the fourth switch SW4, the correction voltage $V_A$ is set to the capacitor voltage $V_{CA4}$. With the wireless power receiving apparatus 4c, the capacitor voltages $V_{CA1}$ and $V_{CA2}$ can be optimized so as to provide a quasi-resonant state in both the state in which $f_{TX}>f_c$ and the state in which $f_{TX}<f_c$.

With such a wireless power receiving apparatus, the third switch SW3 and the fourth switch SW4 may each be configured as a uni-directional switch or otherwise a bi-directional switch. In a case in which the third switch SW3 and the fourth switch SW4 are each configured as a uni-directional switch, there is a need to switch on and off the third switch SW3 and the fourth switch SW4 with a phase such that no current flows through each of the inversely conducting elements.

Figure 19A:
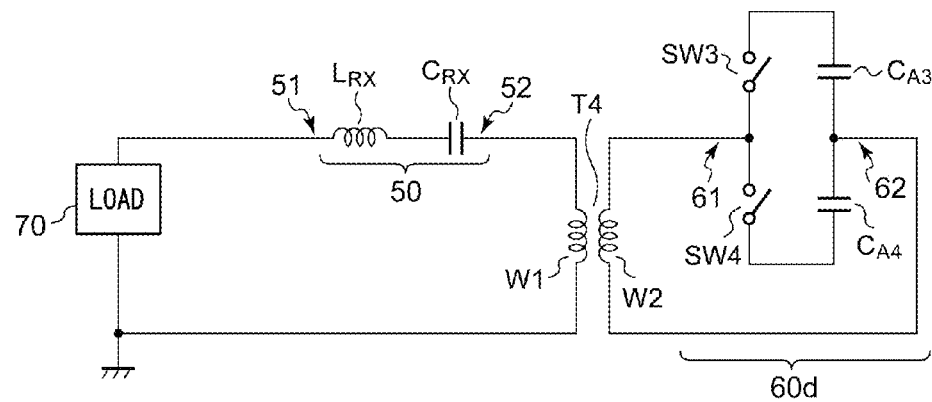
FIGS. 19A and 19B are circuit diagrams showing the configurations of wireless power receiving apparatuses according to a fourth modification and a fifth modification, respectively.
Figure 19B:
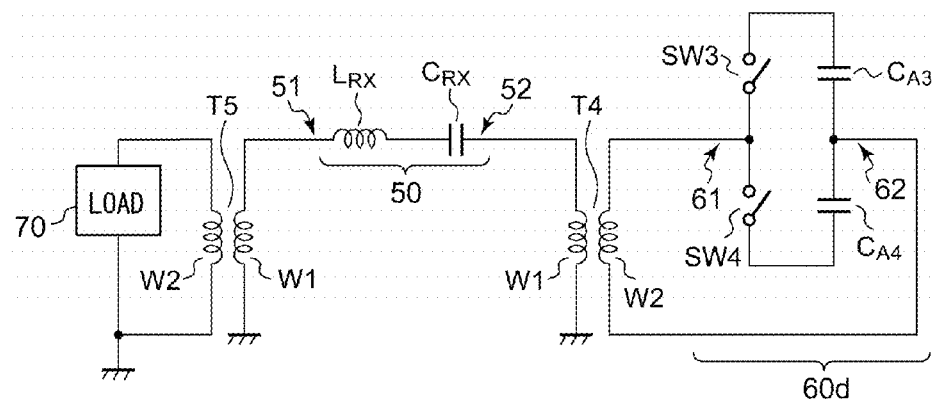

FIGS. 19A and 19B are circuit diagrams showing the configurations of wireless power receiving apparatuses according to a fourth modification and a fifth modification, respectively. The second controller 64 is omitted from the diagrams.

With a wireless power receiving apparatus 4d shown in FIG. 19A, an automatic tuning assist circuit 60d is coupled in series with the reception antenna 50 via a fourth transformer T4. Specifically, the secondary winding W2 of the fourth transformer T4 is arranged between the first terminal 61 and the second terminal 62. The primary winding W1 of the fourth transformer T4 is arranged in series with the reception antenna 50.

With the wireless power receiving apparatus 4d, energy is transmitted and received between the reception antenna 50 and the automatic tuning assist circuit 60d via the fourth transformer T4. Such an arrangement provides the same advantages as those provided by the wireless power receiving apparatuses described above.

FIG. 19B shows an arrangement in which the load 70 is coupled with the reception antenna 50 and the automatic tuning assist circuit 60d via a fifth transformer T5. Specifically, the primary winding W1 of the fifth transformer T5 is connected in series with the reception antenna 50. The load 70 is connected between both ends of the secondary winding W2 of the fifth transformer T5.

Such an arrangement also provides the same advantages as those provided by the wireless power receiving apparatuses described above. With such a wireless power receiving apparatus 4e, the fourth transformer T4 may be omitted. With such an arrangement shown in FIG. 19A, the load 70 may be coupled with the third auxiliary capacitor $C_{A3}$. Also, with such an arrangement shown in FIG. 19B, the load 70 may be coupled with the third capacitor $C_{A3}$ via a fifth transformer T5.

[Wireless Power Supply System]

By combining the wireless power transmitting apparatus and the wireless power receiving apparatus described above, such an arrangement provides a wireless power supply system.

Figure 20:
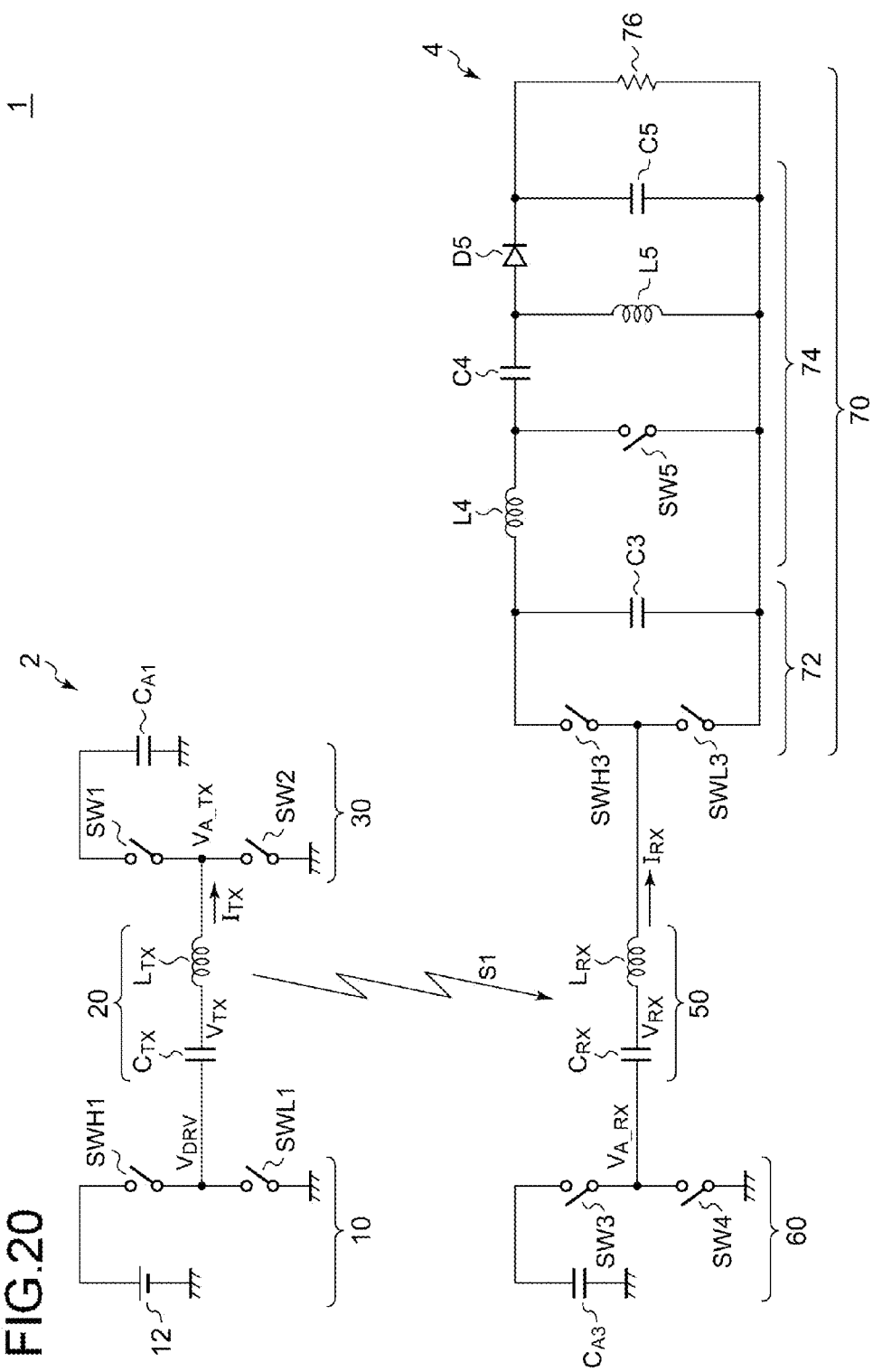
FIG. 20 is a circuit diagram showing an example configuration of a wireless power supply system according to the first embodiment.

FIG. 20 is a circuit diagram showing an example configuration of a wireless power supply system according to the first embodiment. The wireless power supply system 1 includes the wireless power transmitting apparatus 2 and the wireless power receiving apparatus 4.

The load 70 includes a rectifier circuit 72 and a switching regulator 74, in addition to a load circuit 76. The rectifier circuit 72 is configured as a synchronous detector circuit, and includes a smoothing capacitor C3, a third high-side switch SWH3, and a third low-side switch SWL3.

The switching regulator 74 is configured as a step-up converter, and controlled so as to be capable of supplying the load circuit 76 with the maximum electric power. The configuration and the operation of the switching regulator 74 are known, and accordingly, description thereof will be omitted.

Figure 21:
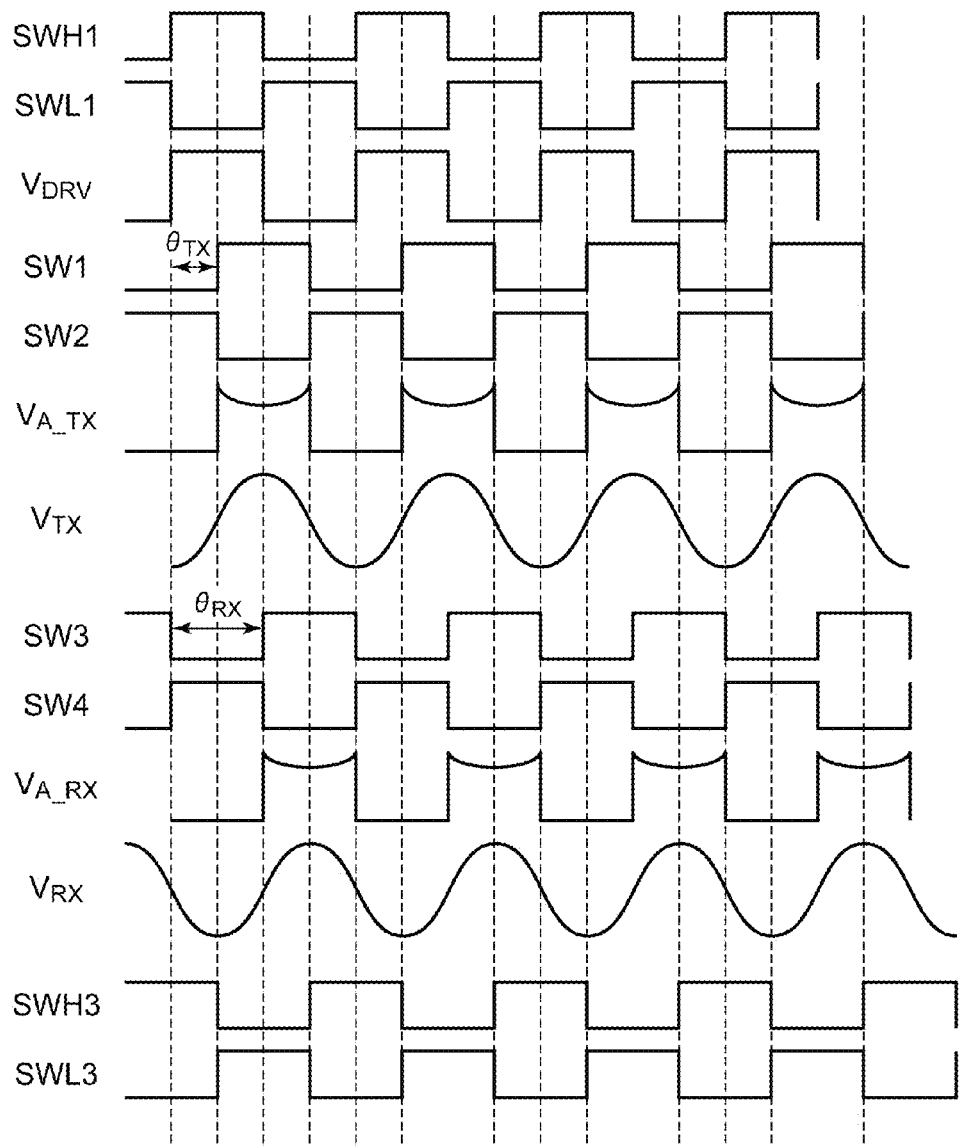
FIG. 21 is a waveform diagram showing the operation of the wireless power supply system shown in FIG. 20.

The above is the configuration of the wireless power supply system 1. FIG. 21 is a waveform diagram showing the operation of the wireless power supply system 1 shown in FIG. 20.

With the wireless power transmitting apparatus 2, the first switch SW1 and the second switch SW2 are driven with a phase that is delayed by $\theta_{TX}$=90 degrees with respect to the driving voltage $V_{DRV}$. As a result, the wireless power transmitting apparatus 2 provides a quasi-resonant state.

With the wireless power receiving apparatus 4, the third switch SW3 and the fourth switch SW4 are driven with a phase that is delayed by $\theta_{RX}$=180 degrees with respect to the driving voltage $V_{DRV}$ employed on the wireless power transmitting apparatus 2 side. The third switch SW3 is driven with a phase that is delayed by 90 degrees with respect to the first switch SW1. As a result, the wireless power receiving apparatus 4 also provides a quasi-resonant state.

The third high-side switch SWH3 and the third low-side switch SWL3 of the rectifier circuit 72 are driven with a phase that is delayed by 90 degrees with respect to the third switch SW3 and the fourth switch SW4. As a result, a DC voltage is generated at the smoothing capacitor C3. The switching regulator 74 converts the DC voltage thus generated into an optimum voltage level for the load circuit 76.

The above is the operation of the wireless power supply system 1. As described above, with the wireless power supply system 1, the wireless power transmitting apparatus 2 and the wireless power receiving apparatus 4 each include an automatic tuning assist circuit. Thus, such an arrangement allows the maximum electric power to be transmitted to the load 70.

It is needless to say that any of the aforementioned wireless power transmitting apparatuses 2 including the modifications may be combined with any of the aforementioned wireless power receiving apparatuses 4 including the modifications.

Description has been made with reference to FIG. 20 regarding an arrangement in which an automatic tuning assist circuit is mounted on both the wireless power transmitting apparatus 2 and the wireless power receiving apparatus 4. However, the present invention is not restricted to such an arrangement.

Also, an arrangement may be made in which such an automatic tuning assist circuit is provided to only the wireless power transmitting apparatus 2, and the wireless power receiving apparatus adjusts the resonance capacitor $C_{RX}$ in the same way as with conventional techniques.

Conversely, an arrangement may be made in which such an automatic tuning assist circuit is provided to only the wireless power receiving apparatus 4, and the wireless power transmitting apparatus 2 adjusts the resonance capacitor $C_{TX}$ in the same way as with conventional techniques.

Also, an arrangement may be made in which such an automatic tuning assist circuit is provided to only the wireless power transmitting apparatus 2, and the wireless power receiving apparatus 4 has no adjustment mechanism. Alternatively, an arrangement may be made in which such an automatic tuning assist circuit is provided to only the wireless power receiving apparatus 4, and the wireless power transmitting apparatus 2 has no adjustment mechanism.

With such arrangements, tuning is performed by means of a single automatic tuning assist circuit so as to provide impedance matching between the power supply 10 and the load 70, thereby providing high-efficiency electric power transmission. It is needless to say that, with such arrangements, the optimum value of the phase $\theta_{TX}$ ($\theta_{RX}$) of the switching of the automatic tuning assist circuit does not match the aforementioned values, i.e., 90 degrees or otherwise 270 degrees (180 degrees or otherwise 0 degrees).

Description has been made regarding the present invention with reference to the first embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

With the wireless power transmitting apparatus 2 including the automatic tuning assist circuit 30, in some cases, such an arrangement is capable of providing a quasi-resonant state even without including the resonance capacitor $C_{TX}$. In this case, such a resonance capacitor $C_{TX}$ may be omitted. In the same way, an arrangement may be made in which the wireless power receiving apparatus 4 including the automatic tuning assist circuit 60 does not include the resonance capacitor $C_{RX}$.

The wireless power transmitting apparatus 2 encrypts the electric power signal S1 by changing at least one of the frequency $f_{TX}$ and the phase of the driving voltage $V_{DRV}$ according to a predetermined rule (encryption code). In a case in which the wireless power receiving apparatus 4 knows the encryption code, the wireless power receiving apparatus 4 controls the switching frequency and phase of the automatic tuning assist circuit 60 based on the encryption code. As a result, even if the electric power signal S1 is encrypted, such an arrangement is capable of decrypting the electric power signal S1 and receiving the power supply. In a case in which a wireless power receiving apparatus does not know the encryption code, the wireless power receiving apparatus cannot appropriately control the switching operation of the automatic tuning assist circuit 60. Thus, such a wireless power receiving apparatus cannot receive electric power. With wireless power transmission, there is a problem of potential power theft by malicious users. However, by employing such an automatic tuning assist circuit, such a problem can be solved.

Also, in a case in which a single wireless power transmitting apparatus 2 supplies electric power to multiple wireless power receiving apparatuses 4, by employing such an automatic tuning assist circuit, such an arrangement is capable of controlling the amount of electric power to be supplied to each terminal.

Second Embodiment

Description has been made in the first embodiment regarding the automatic tuning assist circuit including the two switches SW1 and SW2. An automatic tuning assist circuit according to a second embodiment has a configuration including four switches. The automatic tuning assist circuit according to the second embodiment has the same block configuration as that of the first embodiment except for the automatic tuning assist circuit 80. Also, various kinds of modifications as described in the first embodiment may effectively be made for the second embodiment.

[Wireless Power Receiving Apparatus]

Figure 22:
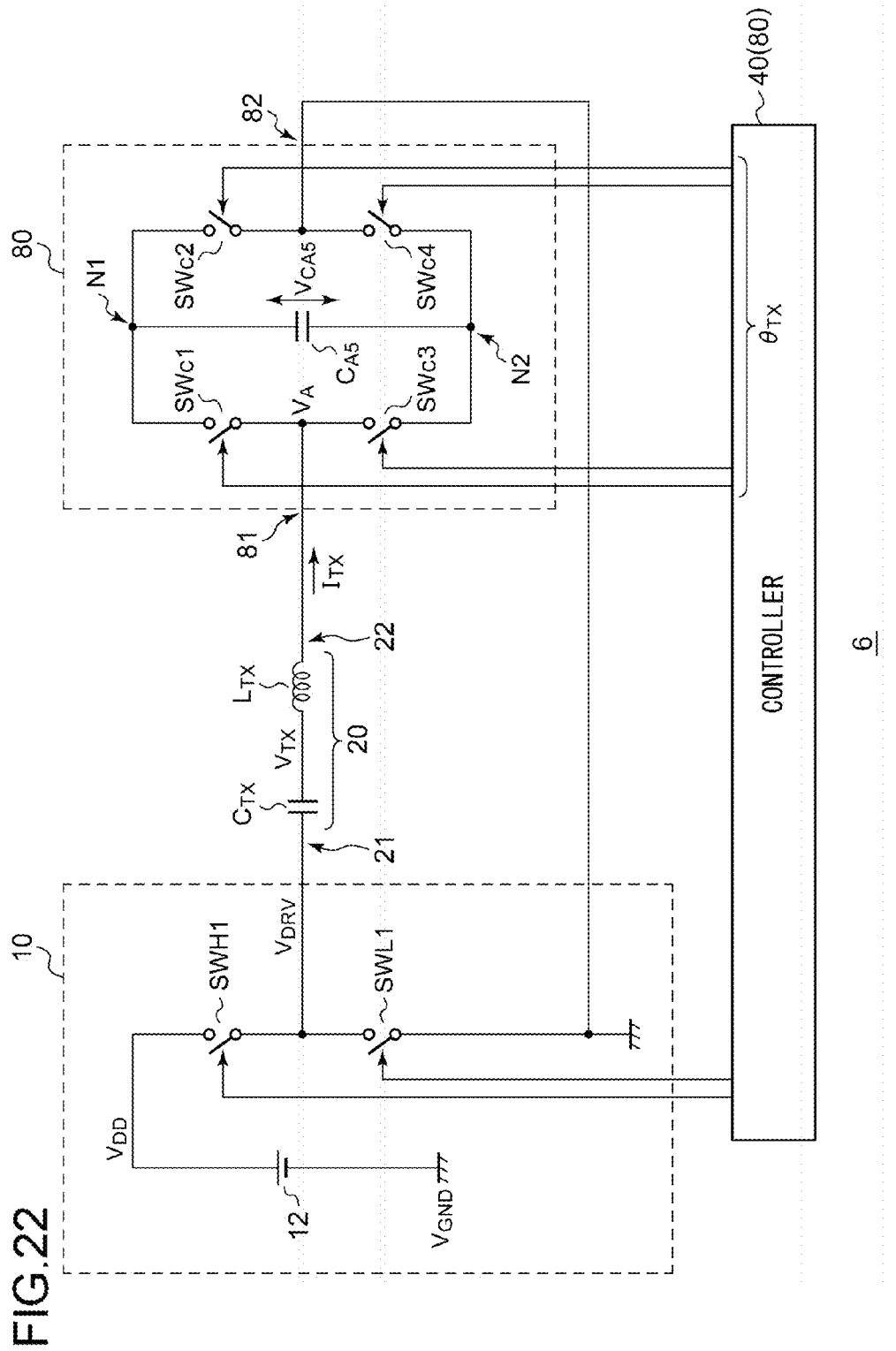
FIG. 22 is a circuit diagram showing a configuration of a wireless power transmitting apparatus according to a second embodiment.

FIG. 22 is a circuit diagram showing a configuration of a wireless power transmitting apparatus 2 according to a second embodiment. The wireless power transmitting apparatus 2 transmits an electric power signal S1 to a wireless power receiving apparatus (not shown). The electric power signal S1 is configured using the near-field components (electric field, magnetic field, or electromagnetic field) of electromagnetic waves that have not yet become radio waves.

The wireless power transmitting apparatus 6 includes a power supply 10, a transmission antenna 20, an automatic tuning assist circuit 80, and a first controller 40.

The transmission antenna 20 includes a transmission coil $L_{TX}$ arranged between its first terminal 21 and its second terminal 22. A resonance capacitor $C_{TX}$ is arranged in series with the transmission coil $L_{TX}$. The resonance capacitor $C_{TX}$ and the transmission coil $L_{TX}$ may also be mutually exchanged.

The automatic tuning assist circuit 80 is coupled in series with the transmission antenna 20. The power supply 10 is configured as a half-bridge circuit in the same way as shown in FIG. 2. The power supply 10 applies an AC driving voltage $V_{DRV}$ having a predetermined transmission frequency $f_{TX}$ across a series circuit that comprises the transmission antenna 20 and the automatic tuning assist circuit 80. The driving voltage $V_{DRV}$ may be configured to have a desired AC waveform, examples of which include a rectangular waveform, a trapezoidal waveform, a sine waveform, and the like. With the present embodiment, the driving voltage $V_{DRV}$ is configured as a rectangular wave signal which swings between a first voltage level (power supply voltage $V_{DD}$) and a second voltage level (ground voltage $V_{GND}$=0 V).

The power supply 10 is configured as a half-bridge circuit, as with the power supply 10 shown in FIG. 2. The first controller 40 switches on and off the first high-side switch SWH1 and the first low-side switch SWL1 in a complementary manner, with a transmission frequency $f_{TX}$.

With the second embodiment, the automatic tuning assist circuit 80 includes a first terminal 81, a second terminal 82, a first switch SWc1 through a fourth switch SWc4, and a first auxiliary capacitor $C_{A5}$.

The first switch SWc1 and the second switch SWc2 are sequentially arranged in series between the first terminal 81 and the second terminal 82. The third switch SWc3 and the fourth switch SWc4 are sequentially arranged between the first terminal 81 and the second terminal 82, and are arranged in parallel with the first switch SWc1 and the second switch SWc2. The first auxiliary capacitor $C_{A5}$ is arranged between a connection node N1 that connects the first switch SWc1 and the second switch SWc2 and a connection node N2 that connects the third switch SWc3 and the fourth switch SWc4. The first auxiliary capacitor $C_{A5}$ is preferably configured to have a capacitance that is sufficiently greater than that of the resonance capacitor $C_{TX}$.

The first controller 40 switches on and off the first switch SWc1 through the fourth switch SWc4 in a complementary manner, with the same frequency $f_{TX}$ as that of the driving voltage $V_{DRV}$, and with a predetermined phase difference $\theta_{TX}$ with respect to the driving voltage $V_{DRV}$. The phase difference $\theta_{TX}$ is preferably set to a value in the vicinity of +90 degrees or otherwise −90 degrees (270 degrees). That is to say, a part of the first controller 40 functions as a component of the automatic tuning assist circuit 80.

In the same way as with the first embodiment, the first switch SWc1 through the fourth switch SWc4 may each be configured as a uni-directional switch or otherwise a bi-directional switch. In a case in which the first switch SWc1 through the fourth switch SWc4 are each configured as a uni-directional switch, there is a need to pay attention to their switching phases, as described above in the first embodiment.

The above is the configuration of the wireless power transmitting apparatus 6. Next, description will be made regarding the operation thereof.

Figure 23:
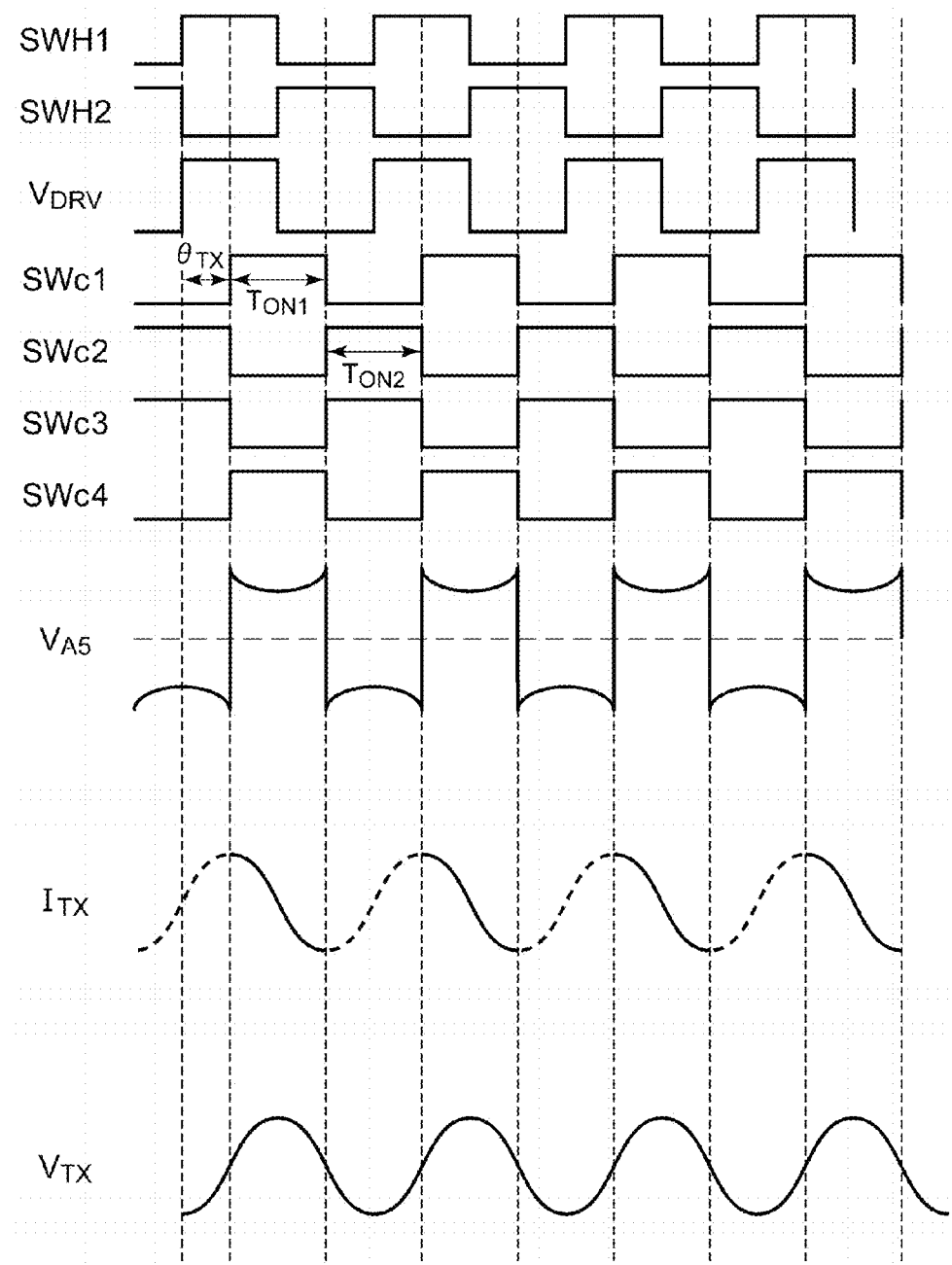
FIG. 23 is a waveform diagram showing the operation of the wireless power transmitting apparatus shown in FIG. 22.

FIG. 23 is a waveform diagram showing the operation of the wireless power transmitting apparatus 6 shown in FIG. 22. FIG. 23 shows, in the following order beginning from the top, the voltage at the first high-side switch SWH1, the voltage at the first low-side switch SWL1, the driving voltage $V_{DRV}$, the voltage at the first switch SWc1, the voltage at the second switch SWc2, the voltage at the third switch SWc3, the voltage at the fourth switch SWc4, the correction voltage $V_A$ generated at the first terminal 81, the resonance current $I_{TX}$ that flows through the transmission antenna 20, and the resonance voltage $V_{TX}$ that develops across a series circuit including the transmission coil $L_{TX}$ and the resonance capacitor $C_{TX}$. In the waveform diagram for each switch, the high level represents the on state, and the low level represents the off state. It should be noted that FIG. 23 shows the waveforms of the resonance current $I_{TX}$ and the resonance voltage $V_{TX}$ obtained after a sufficient time has elapsed after the automatic tuning assist circuit 80 starts to operate.

As shown in FIG. 23, by switching on and off the first high-side switch SWH1 and the first low-side switch SWL1 in a complementary manner, such an arrangement is capable of generating the driving voltage $V_{DRV}$ having a rectangular waveform. The driving voltage $V_{DRV}$ thus generated is applied across a series circuit including the transmission antenna 20 and the automatic tuning assist circuit 80a. The first controller 40 drives a first pair P1 comprising the first switch SWc1 and the fourth switch SWc4 with the same frequency as that of the driving voltage $V_{DRV}$, and with a phase that is delayed by $\theta_{TX}$ (=90 degrees) with respect to the driving voltage $V_{DRV}$. Furthermore, the first controller 40 drives a second pair P2 comprising the second switch SWc2 and the third switch SWc3 in a complementary manner with respect to the first pair P1, i.e., with a phase that is shifted by 180 degrees with respect to that of the first pair P1.

During the on time $T_{ON1}$ of the first pair P1, the resonance current $I_{TX}$ flows through a path including the first switch SWc1, the first auxiliary capacitor $C_{A5}$, and the fourth switch SWc4. During the on time $T_{ON2}$ of the second pair P2, the resonance current $I_{TX}$ flows through a path including the third switch SWc3, the first auxiliary capacitor $C_{A5}$, and the second switch SWc2.

That is to say, the first auxiliary capacitor $C_{A5}$ is charged and discharged by means of the resonance current $I_{TX}$. As a result, the capacitor voltage $V_{CA5}$ develops at the first auxiliary capacitor $C_{A5}$.

The automatic tuning assist circuit 80 applies a correction voltage $V_A$ to the second terminal 22 of the transmission antenna 20. During the on time $T_{ON1}$ of the first pair P1, the correction voltage $V_A$ is set to a first polarity. During the on time $T_{ON2}$ of the second pair P2, the correction voltage $V_A$ is set to a second polarity. The automatic tuning assist circuit 80 can be regarded as a correction power supply configured to apply the correction voltage $V_A$ to the transmission antenna 20. That is to say, it can be clearly understood that the wireless power transmitting apparatus 6 can be represented by the same equivalent circuit as that shown in FIG. 5, and is configured to operate according to the same operation mechanism.

That is to say, in a case in which the automatic tuning assist circuit 80 operates, the correction voltage $V_A$ is applied to the transmission antenna 20 with a phase that is delayed by $\theta_{TX}$=90 degrees with respect to the driving voltage $V_{DRV}$. As a result, phase matching is obtained between the resonance current $I_{TX}$ and the driving voltage $V_{DRV}$, thereby providing a quasi-resonant state. In this state, the resonance current $I_{TX}$ has a greater amplitude than that in the non-resonant state. This is as shown in the phasor diagrams in FIGS. 7 and 9.

The operation of the automatic tuning assist circuit 80 according to the second embodiment is the same as described in the first embodiment with reference to FIG. 8. Thus, such an arrangement is capable of automatically generating the correction voltage $V_A$ which provides a quasi-resonant state.

The above is the operation of the wireless power transmitting apparatus 6.

As described above, without adjusting the resonance frequency $f_c$ of the transmission antenna 20, the wireless power transmitting apparatus 6 is capable of automatically tuning the circuit state so as to provide the quasi-resonant state. In the wireless power transmission, the resonance frequency changes over time according to the position relation between the wireless power transmitting apparatus and the wireless power receiving apparatus. The wireless power transmitting apparatus 6 is capable of following the change in the resonance frequency with high speed, thereby providing high-efficiency electric power transmission.

Furthermore, in a case in which a large amount of electric power is transmitted by means of wireless power transmission, a very high voltage across the resonance capacitor $C_{TX}$, which limits the use of a variable capacitor. With the wireless power transmitting apparatus 6, there is no need to adjust the capacitance of the resonance capacitor $C_{TX}$. Thus, such an arrangement does not require such a variable capacitor or the like, which is another advantage.

Description has been made above regarding an arrangement in which the first pair comprising the first switch SWc1 and the fourth switch SWc4 is switched on and off with a phase that is delayed by $\theta_{TX}$ (=90 degrees) with respect to the phase of the switching of the first high-side switch SWH1 (driving voltage $V_{DRV}$). However, the phase difference $\theta_{TX}$ between the first pair and the first high-side switch SWH1 is not restricted to 90 degrees. Also, an arrangement may be made in which the phase difference $\theta_{TX}$ between the first pair and the first high-side switch SWH1 is set to 270 degrees (−90 degrees). In this case, the capacitor voltage $V_{CA1}$ is automatically adjusted such that the polarity reverses. In a case in which the first switch SWc1 through the fourth switch SWc4 are each configured as a unidirectional switch, there is a need to switch on and off the first switch SWc1 through the fourth switch SWc4 with a phase such that no current flows through each of the inversely conducting elements. Specifically, in a case in which $f_c<f_{TX}$, the phase difference $\theta_{TX}$ is preferably set to 90 degrees. Conversely, in a case in which $f_c>f_{TX}$, the phase difference $\theta_{TX}$ is preferably set to 270 degrees.

Also, the phase difference $\theta_{TX}$ may be moved away from 90 degrees or 270 degrees, as described in the first embodiment.

Next, description will be made regarding modifications of the wireless power transmitting apparatus 6. Each modification may be combined with any one of the other modifications, which is encompassed within the scope of the present invention.

FIG. 24 is a circuit diagram showing a configuration of a wireless power transmitting apparatus 6a according to a first modification. A power supply 10c shown in FIG. 24 is configured as an H-bridge circuit. A transmission antenna 20 and an automatic tuning assist circuit 80a are arranged in series between a first output terminal OUT1 and a second output terminal OUT2 of a power supply 10c. Furthermore, a capacitor C2 configured to block DC current is arranged in series with the transmission antenna 20 and the automatic tuning assist circuit 80a. With the automatic tuning assist circuit 80a, one end (N2) of a first auxiliary capacitor $C_{A5}$ is grounded.

With the wireless power transmitting apparatus 6a shown in FIG. 24, such an arrangement provides the same advantages as those provided by the wireless power transmitting apparatuses described above.

Figure 25A:
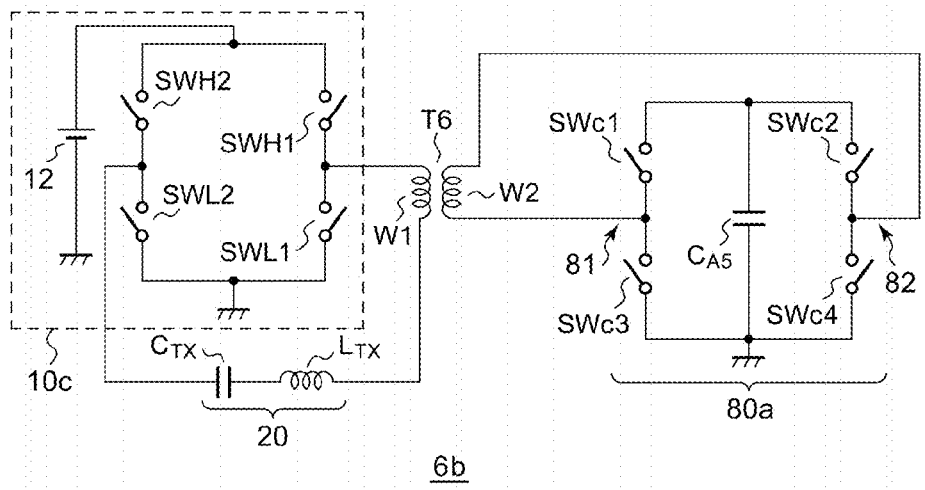
FIGS. 25A through 25C are circuit diagrams showing the configurations of wireless power transmitting apparatuses according to a second modification through a fourth modification, respectively.
Figure 25B:
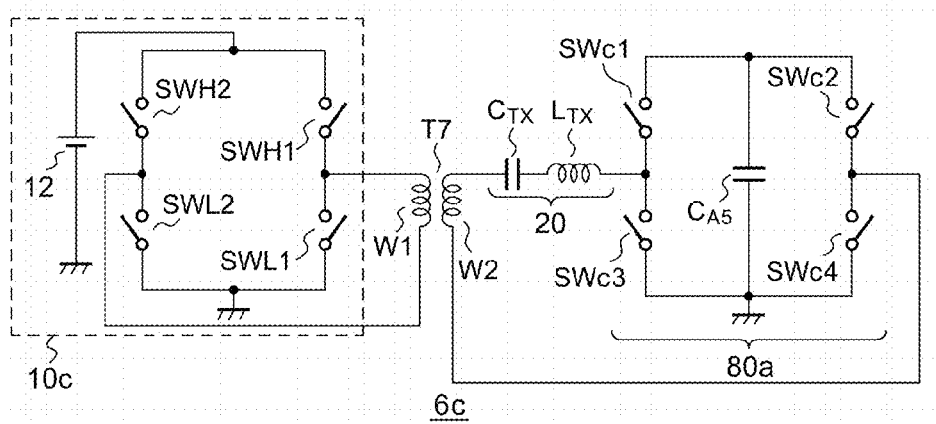
Figure 25C:
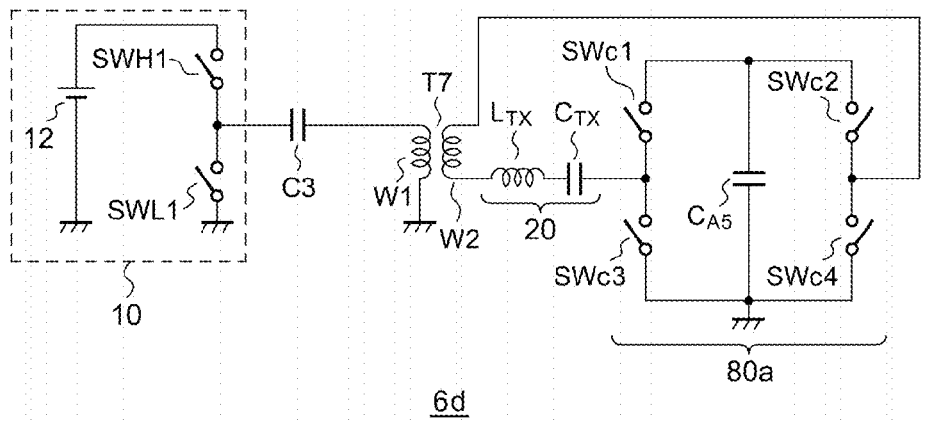

As described in the first embodiment, the power supply, the automatic tuning assist circuit, or otherwise both of them, may be coupled with the transmission antenna 20 via a transformer. FIGS. 25A through 25C are circuit diagrams respectively showing the configurations of wireless power transmitting apparatuses 6b through 6d according to second through fourth modifications. The first controller 40 is not shown.

With the wireless power transmitting apparatus 6b shown in FIG. 25A, the automatic tuning assist circuit 80a is coupled in series with the transmission antenna 20 via a sixth transformer T6. Specifically, the sixth transformer T6 is configured to have a primary winding W1 connected in series with the transmission antenna 20, and to have a secondary winding W2 connected between the first terminal 61 and the second terminal 62 of the automatic tuning assist circuit 80a. The power supply 10c applies a driving voltage across a series circuit that comprises the transmission antenna 20 and the primary winding W1 of the sixth transformer T6.

With a wireless power transmitting apparatus 6c shown in FIG. 25B, the power supply 10c is coupled with the transmission antenna 20 and the automatic tuning assist circuit 80a via a seventh transformer T7. The power supply 10c applies a driving voltage across the primary winding W1 of the seventh transformer T7. The transmission antenna 20 and the automatic tuning assist circuit 80a are arranged in series with the secondary winding W2.

With a wireless power transmitting apparatus 6d shown in FIG. 25C, the power supply 10 having a half-bridge configuration is coupled with the transmission antenna 20 and the automatic tuning assist circuit 80a via the seventh transformer T7. A capacitor C3 configured to block DC current is arranged between the output terminal of the power supply 10 and the first winding W1 of the seventh transformer T7.

Also, the modifications shown in FIGS. 25A through 25C may be combined. That is to say, both the power supply and the automatic tuning assist circuit may be coupled with the transmission antenna via a transformer.

Such modifications also provide the same advantages provided by the wireless power transmitting apparatuses described above.

[Wireless Power Receiving Apparatus]

The automatic tuning assist circuit according to the second embodiment described above may be employed in a wireless power receiving apparatus. Description will be made below regarding such a wireless power receiving apparatus.

Figure 26:
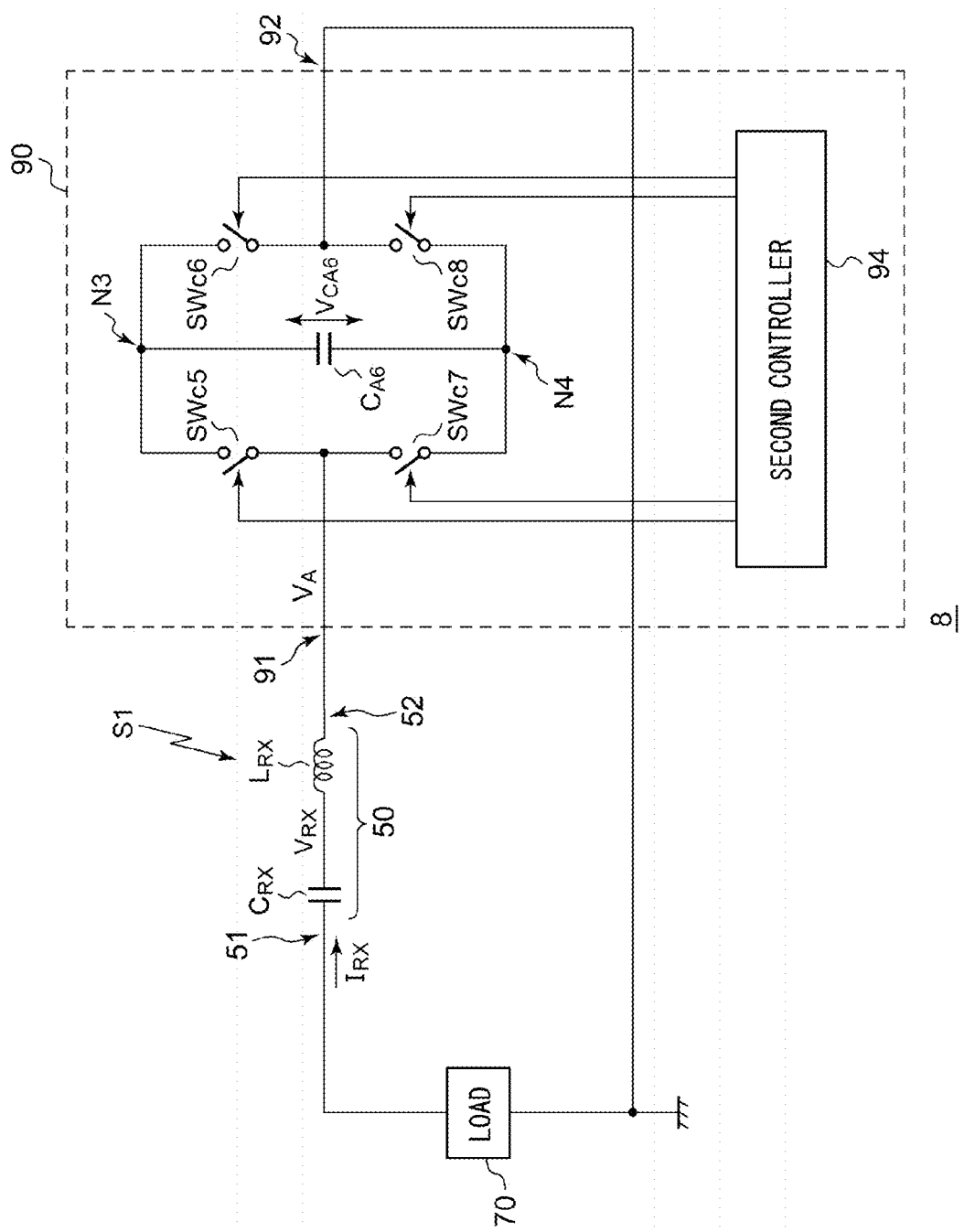
FIG. 26 is a circuit diagram showing a configuration of a wireless power receiving apparatus according to the second embodiment.

FIG. 26 is a circuit diagram showing a wireless power receiving apparatus 8 according to the second embodiment. The wireless power receiving apparatus 8 receives the electric power signal S1 transmitted from the aforementioned wireless power transmitting apparatus or otherwise a wireless power transmitting apparatus having an entirely different configuration. The electric power signal S1 is configured using the near-field components (electric field, magnetic field, or electromagnetic field) of electromagnetic waves that have not yet become radio waves.

The wireless power receiving apparatus 8 includes a reception antenna 50, an automatic tuning assist circuit 90, and a load 70 to be supplied with electric power. The load 70 may include an unshown rectifier circuit, detector circuit, or the like, as a built-in component.

The reception antenna 50 includes a reception coil $L_{RX}$ and a resonance capacitor $C_{RX}$ arranged in series between a first terminal 51 and a second terminal 52.

The automatic tuning assist circuit 90 has the same configuration as that of the automatic tuning assist circuit 80 shown in FIG. 22. Specifically, the automatic tuning assist circuit 90 includes a first terminal 91, a fifth switch SWc5 through an eighth switch SWc8, and a second auxiliary capacitor $C_{A6}$.

The fifth switch SWc5 and the sixth switch SWc6 are arranged in series between the first terminal 91 and the second terminal 92. The seventh switch SWc7 and the eighth switch SWc8 are sequentially arranged in series between the first terminal 91 and the second terminal 92. Furthermore, the seventh switch SWc7 and the eighth switch SWc8 are arranged in parallel with the fifth switch SWc5 and the sixth switch SWc6. The second auxiliary capacitor $C_{A6}$ is arranged between a connection node N3 that connects the fifth switch SWc5 and the sixth switch SWc6 and a connection node N4 that connects the seventh switch SWc7 and the eighth switch SWc8. The second auxiliary capacitor $C_{A6}$ is preferably configured to have a sufficiently great capacitance as compared with the resonance capacitance $C_{RX}$.

A second controller 94 is configured to switch on and off the fifth switch SWc5 through the eighth switch SWc8 with the same frequency as that of the electric power signal S1, and with a phase difference $\theta_{RX}$ with respect to the driving voltage ($V_{DRV}$) which is applied to the transmitter-side antenna. For example, the phase difference $\theta_{RX}$ is preferably set to 180 degrees or otherwise 0 degrees.

The automatic tuning assist circuit 90 is coupled in series with the reception antenna 50. Furthermore, the load 70 to be supplied with electric power is directly connected with the reception antenna 50 and the automatic tuning assist circuit 90.

The above is the configuration of the wireless power receiving apparatus 8. Next, description will be made regarding the operation thereof. The wireless power receiving apparatus 8 can be represented by the same equivalent circuit diagram as that which represents the wireless power receiving apparatus 4 shown in FIG. 15. As with the automatic tuning assist circuit 80 of the wireless power transmitting apparatus 6, the automatic tuning assist circuit 90 can be regarded as a correction power supply configured to apply a correction voltage $V_A$ to the reception antenna 50.

Figure 27:
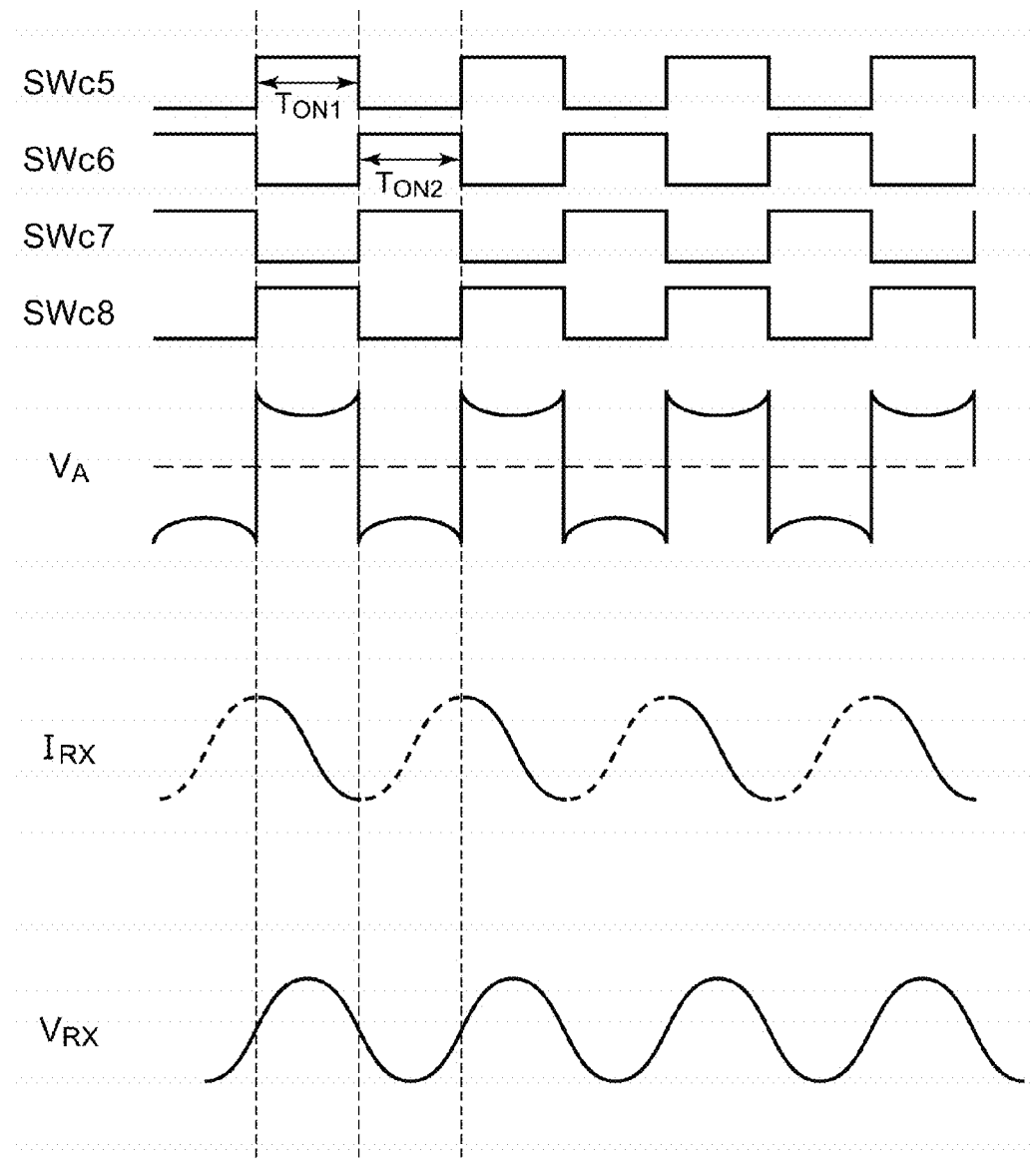
FIG. 27 is a waveform diagram showing the operation of the wireless power receiving apparatus shown in FIG. 26.

FIG. 27 is a waveform diagram showing the operation of the wireless power receiving apparatus 8 shown in FIG. 26. FIG. 27 shows the voltages applied to the fifth switch SWc5 through the eighth switch SWc8, the correction voltage $V_A$, the resonance current $I_{RX}$ that flows through the reception antenna 50, and the resonance voltage $V_{RX}$ that develops across a series circuit including the reception coil $L_{RX}$ and the resonance capacitor C. In the waveform diagrams showing the voltages applied to the respective switches, the high-level state represents the on state, and the low-level state represents the off state.

A first pair comprising the fifth switch SWc5 and the eighth switch SWc8 is switched on and off with a phase $\theta_{RX}$ which is shifted by 180 degrees or otherwise 0 degrees with respect to the driving voltage $V_{DRV}$ of the wireless power transmitting apparatus side. A second pair comprising the sixth switch SWc6 and the seventh switch SWc7 is switched on and off in a complementary manner with respect to the first pair. During the on time $T_{ON1}$ of the first pair, the resonance current $I_{RX}$ flows through a path comprising the fifth switch SWc5, the second auxiliary capacitor $C_{A6}$, and the eighth switch SWc8. During the on time $T_{ON2}$ of the second pair, the resonance current $I_{RX}$ flows through a path comprising the sixth switch SWc6, the second auxiliary capacitor $C_{A6}$, and the seventh switch SWc7.

The second auxiliary capacitor $C_{A6}$ is charged and discharged by means of the resonance current $I_{RX}$. As a result, a capacitor voltage $V_{CA6}$ develops at the capacitor $C_{A6}$. With such an arrangement, the correction voltage $V_A$ that corresponds to the capacitor voltage $V_{CA6}$ is applied to the reception antenna 50. Thus, such an arrangement allows the resonance current $I_A$ to have a phase that matches the phase of the driving voltage $V_{DRV}$ that is used in the transmitter side, thereby providing a quasi-resonant state.

In order to provide a quasi-resonant state, there is a need to switch on and off the fifth switch SWc5 and the eighth switch SWc8 with a suitable frequency $f_{TX}$ and with a suitable phase $\theta_{RX}$. In order to meet this requirement, the wireless power transmitting apparatus may be configured to transmit the data which represents the frequency $f_{TX}$ and the phase $\theta_{RX}$ to the wireless power receiving apparatus 8. Also, the wireless power receiving apparatus 8 may be configured to sweep the phase $\theta_{RX}$ so as to detect the optimum phase $\theta_{RX}$.

The above is the operation of the wireless power receiving apparatus 8.

As described above, with the wireless power receiving apparatus 8 shown in FIG. 26, such an arrangement automatically provides a resonant state without a need to adjust the capacitance of the resonance capacitor $C_{RX}$.

Next, description will be made regarding modifications of the wireless power receiving apparatus 8.

Description has been made with reference to FIG. 26 regarding an arrangement in which one terminal of the load 70 is grounded, and the ground potential is used as the reference potential. Also, instead of such an arrangement in which one terminal of the load 70 is grounded, one terminal of the second auxiliary capacitor $C_{A6}$ of the automatic tuning assist circuit 90, i.e., either the connection node N3 or N4, may be grounded.

Figure 28A:
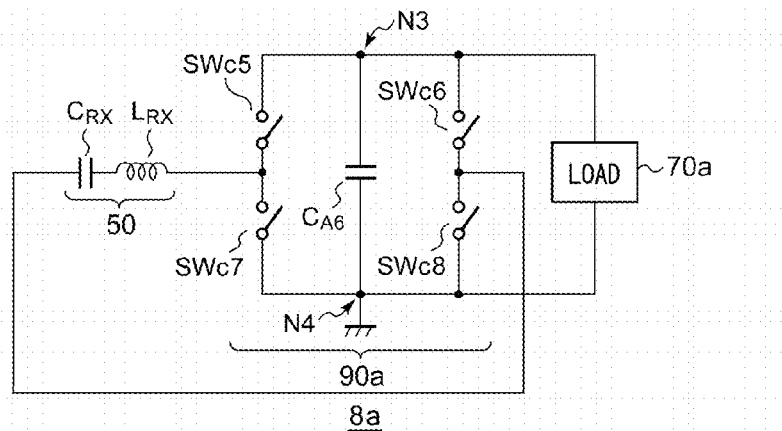
FIGS. 28A and 28B are circuit diagrams showing the configurations of wireless power receiving apparatuses according to a second modification and a third modification.
Figure 28B:
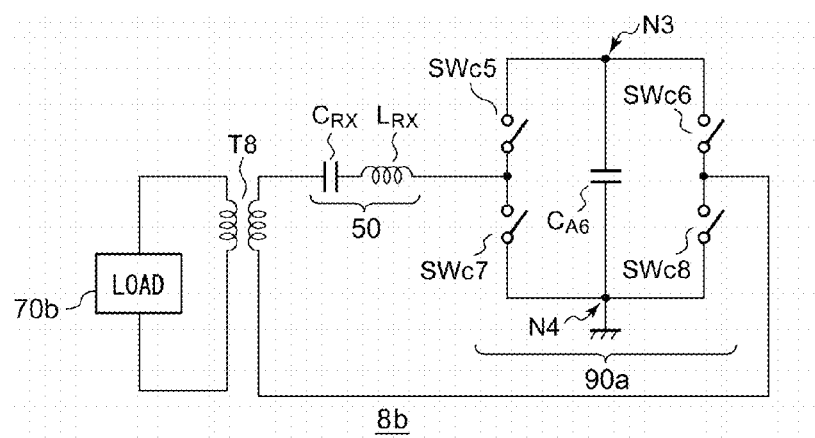

FIGS. 28A and 28B are circuit diagrams showing the configurations of wireless power receiving apparatuses according to a second modification and a third modification.

Description has been made with reference to FIG. 26 regarding an arrangement in which the load 70 is connected in series with the reception antenna 50. Also, the load 70 may be arranged at a different position.

With a wireless power receiving apparatus 8a according to a first modification shown in FIG. 28A, the connection node N4 of the automatic tuning assist circuit 90a is grounded. A load 70a is arranged in parallel with the second auxiliary capacitor $C_{A6}$. That is to say, the load 70a is supplied with a capacitor voltage $V_{CA6}$ that develops at the second auxiliary capacitor $C_{A6}$.

With a wireless power receiving apparatus 8b according to a second modification shown in FIG. 28B, a load 70b is coupled via an eighth transformer T8 with a series circuit comprising the reception antenna 50 and the automatic tuning assist circuit 90a.

Figures 28C, 28D:
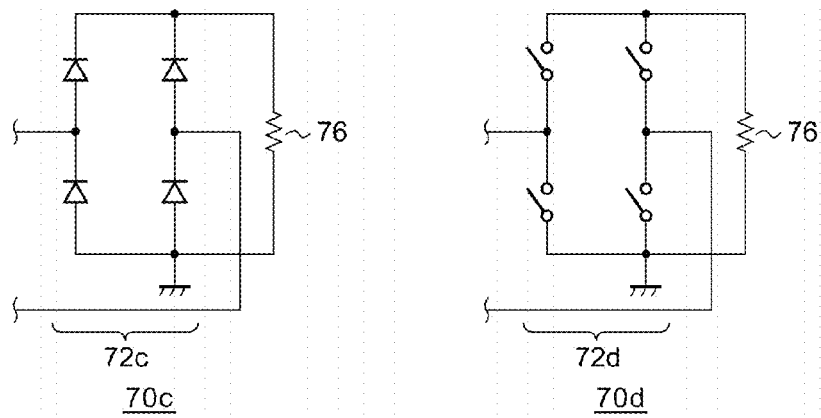
FIGS. 28C and 28D are circuit diagrams each showing an example configuration of a load.

FIGS. 28C and 28D are circuit diagrams each showing an example configuration of such a load. A load 70c shown in FIG. 28C includes a diode rectifier circuit 72c and a load circuit 76. A load 70d shown in FIG. 28D includes a synchronous detector circuit 72d and the load circuit 76. Such a load circuit may further include a switching regulator 74 as shown in FIG. 20.

Figure 29:
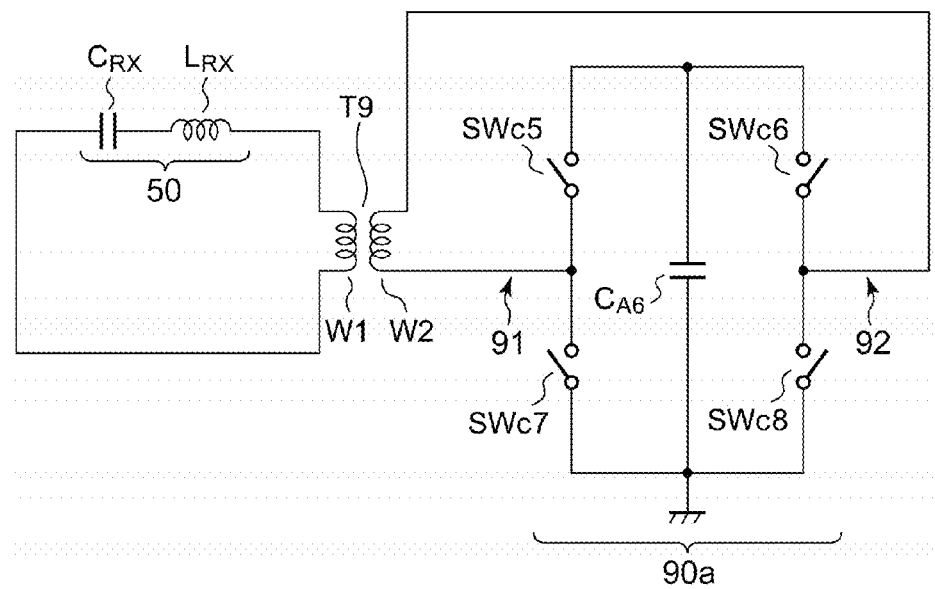
FIG. 29 is a circuit diagram showing a configuration of a wireless power receiving apparatus according to a third modification.

Such an automatic tuning assist circuit 90 may be coupled in series with the reception antenna 50 via a transformer. FIG. 29 is a circuit diagram showing a configuration of a wireless power receiving apparatus 8c according to a third modification. The automatic tuning assist circuit 90a is coupled in series with the reception antenna 50 via a ninth transformer T9. A load may be arranged in series with the reception antenna 50 and the primary winding W1. Also, such a load may be arranged in parallel with the second auxiliary capacitor $C_{A6}$.

Such modifications also provide the same advantages as those provided by the wireless power receiving apparatus 8 shown in FIG. 26.

In a case in which the load is connected in series with the reception antenna 50 as shown in FIG. 26, and in a case in which the load has a low impedance, such an arrangement has an advantage of a certain level of acquisition of electric power even without the adjustment by means of the automatic tuning assist circuit 90. However, such an arrangement has a disadvantage of a reduction of the Q-value of the reception antenna 50 due to the resistance component of the load. Thus, it is difficult for such an arrangement to acquire a large amount of electric power.

Conversely, in a case in which electric power is acquired from the automatic tuning assist circuit 90a as shown in FIG. 28A, the Q-value of the reception antenna 50 is not reduced due to the load 70. Thus, such an arrangement is capable of acquiring a large amount of electric power even in a case in which the load 70a has a high impedance. However, in a case in which the load 70a has a very low impedance, such an arrangement has a problem of a reduction in the efficiency of the operation of the automatic tuning assist circuit 60.

Thus, the position of the load in the circuit is preferably determined giving consideration to the electric power to be transmitted, the impedance of the load, and so forth.

The fifth switch SWc5 through the eighth switch SWc8 may each be configured as a uni-directional switch or otherwise a bi-directional switch. As described above, in a case in which these switches are each configured as a uni-directional switch, there is a need to pay attention to their switching phases.

[Wireless Power Supply System]

By combining the wireless power transmitting apparatus 6 and the wireless power receiving apparatus 8 described in the second embodiment, such an arrangement provides a wireless power supply system.

Description has been made regarding an arrangement in which an automatic tuning assist circuit is mounted on each of the wireless power transmitting apparatus 6 and the wireless power receiving apparatus 8. However, the present invention is not restricted to such an arrangement.

Also, an arrangement may be made in which such an automatic tuning assist circuit is provided to only the wireless power transmitting apparatus 6, and the wireless power receiving apparatus adjusts the resonance capacitor $C_{RX}$ in the same way as with conventional techniques. Conversely, an arrangement may be made in which such an automatic tuning assist circuit is provided to only the wireless power receiving apparatus 8, and the wireless power transmitting apparatus 6 adjusts the resonance capacitor $C_{TX}$ in the same way as with conventional techniques.

Also, an arrangement may be made in which such an automatic tuning assist circuit is provided to only the wireless power transmitting apparatus 6, and the wireless power receiving apparatus 8 has no adjustment mechanism. Alternatively, an arrangement may be made in which such an automatic tuning assist circuit is provided to only the wireless power receiving apparatus 8, and the wireless power transmitting apparatus 6 has no adjustment mechanism.

With such arrangements, tuning is performed by means of a single automatic tuning assist circuit so as to provide impedance matching between the power supply 10 and the load 70, thereby providing high-efficiency electric power transmission. It should be noted that, with such arrangements, the optimum value of the phase $\theta_{TX}$ ($\theta_{RX}$) of the switching of the automatic tuning assist circuit does not match the aforementioned values, i.e., 90 degrees or otherwise 270 degrees (180 degrees or otherwise 0 degrees).

Also, the wireless power transmitting apparatus 2 according to the first embodiment may be combined with the wireless power receiving apparatus 8 according to the second embodiment. Also, the wireless power receiving apparatus 4 according to the first embodiment may be combined with the wireless power transmitting apparatus 6 according to the second embodiment.

Description has been made regarding the present invention with reference to the second embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

With the wireless power transmitting apparatus 6 including the automatic tuning assist circuit 80, in some cases, such an arrangement is capable of providing a quasi-resonant state even while omitting the resonance capacitor $C_{TX}$. In this case, such a resonance capacitor $C_{TX}$ may be omitted. In the same way, an arrangement may be made in which the wireless power receiving apparatus 8 including the automatic tuning assist circuit 90 does not include the resonance capacitor $C_{RX}$.

The wireless power transmitting apparatus 6 encrypts the electric power signal S1 by changing at least one of the frequency $f_{TX}$ and the phase of the driving voltage $V_{DRV}$ according to a predetermined rule (encryption code). In a case in which the wireless power receiving apparatus 8 knows the encryption code, the wireless power receiving apparatus 8 controls the switching frequency and phase of the automatic tuning assist circuit 90 based on the encryption code. As a result, even if the electric power signal S1 is encrypted, such an arrangement is capable of decrypting the electric power signal S1 and receiving the power supply. In a case in which the wireless power receiving apparatus does not know the encryption code, the wireless power receiving apparatus cannot appropriately control the switching operation of the automatic tuning assist circuit 90. Thus, such a wireless power receiving apparatus cannot receive electric power. With wireless power transmission, there is a problem of potential power theft by malicious users. However, by employing such an automatic tuning assist circuit, such a problem can be solved.

Also, in a case in which a single wireless power transmitting apparatus 6 supplies electric power to multiple wireless power receiving apparatuses 8, by employing such an automatic tuning assist circuit, such an arrangement is capable of controlling the amount of electric power to be supplied to each terminal.

The usage of the automatic tuning assist circuit 30 is not restricted to such wireless power transmission. Rather, the present invention is applicable to various kinds of applications which require tuning.

Third Embodiment

Description will be made in the third embodiment regarding a technique for damping the magnetic field, electric field, or electromagnetic field, on one face of the transmission coil $L_{TX}$.

[Wireless Power Transmitting Apparatus]

Figure 30:
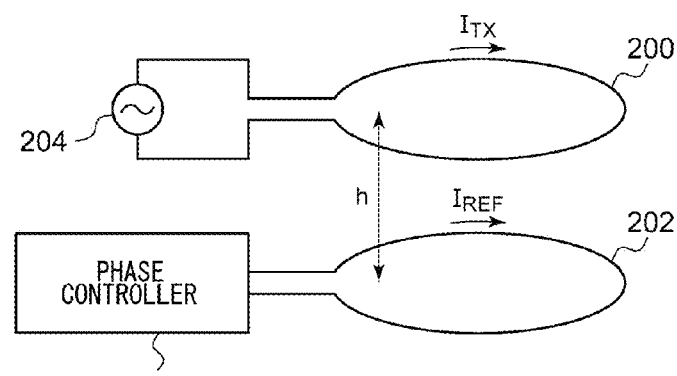
FIG. 30 is a circuit diagram showing a configuration of a wireless power transmitting apparatus according to a third embodiment.

FIG. 30 is a circuit diagram showing a configuration of a wireless power transmitting apparatus 2f according to the third embodiment. The wireless power transmitting apparatus 2f includes a radiation coil 200, a reflector coil 202, a driving power supply 204, and a first phase control circuit 206.

The radiation coil 200 is configured as a spiral coil or a solenoid coil, and corresponds to the transmission coil $L_{TX}$ according to the first and second embodiments. Furthermore, an unshown resonance capacitor $C_{TX}$ may be arranged in series with the radiation coil 200. The reflector coil 202 is also configured as a spiral coil or a solenoid coil, in the same manner as the radiation coil 200. The radiation coil 200 and the reflector coil 202 are arranged such that their coil faces are separated by a distance h.

The driving power supply 204 supplies a driving current $I_{TX}$ to the radiation coil 200. The radiation coil 200 generates a magnetic near field that corresponds to the driving current $I_{TX}$. The driving power supply 204 is preferably configured including the power supply 10 and the automatic tuning assist circuit 30 described in the first embodiment with reference to FIGS. 2, 10, 11, 12, 13A, and 13B.

Alternatively, the driving power supply 204 is configured including the power supply 10 and the automatic tuning assist circuit 80 described in the second embodiment with reference to FIGS. 22, and 24, and FIGS. 25A through 25C.

As shown in FIG. 30, with such an arrangement in which the reflector coil 202 is arranged in the vicinity of the radiation coil 200, if the phase of the current $I_{REF}$ that flows through the reflector coil 202 is changed as described later, this disturbs the resonant state of the resonance circuit including the radiation coil 200. By providing the driving power supply 204 with the automatic tuning assist circuit 30 or 80, such an arrangement allows the radiation coil 200 to be maintained in the resonant state independently of the control state of the reflector coil 202.

The first phase control circuit 206 controls the phase of the current $I_{REF}$ that flows through the reflector coil 202 so as to stably maintain the phase difference θ between the current $I_{REF}$ that flows through the reflector coil 202 and the current $I_{TX}$ that flows through the radiation coil 200 at a predetermined value.

Figure 31:
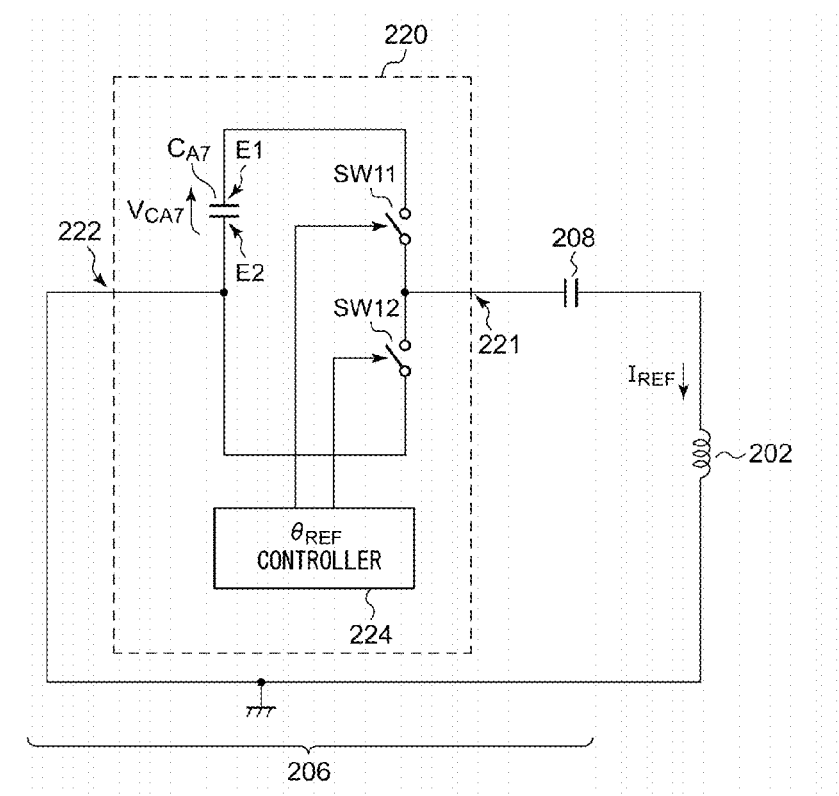
FIG. 31 is a circuit diagram showing an example configuration of a first phase control circuit.

FIG. 31 is a circuit diagram showing an example configuration of the first phase control circuit 206. The first phase control circuit 206 includes an automatic turning assist circuit 220 coupled in series with the reflector coil 202. Also, the first phase control circuit 206 may further include a tuning capacitor 208 arranged in series with the reflector coil 202.

The automatic tuning assist circuit 220 has the same configuration as those of the automatic tuning assist circuit 30 shown in FIG. 2 and the automatic tuning assist circuit 60 shown in FIG. 14. Specifically, the automatic tuning assist circuit 220 includes a first terminal 221, a second terminal 222, an auxiliary capacitor $C_{A7}$, multiple switches SW11 and SW12, and a controller 224. Also, various modifications described in the first embodiment are applicable to the automatic tuning assist circuit 220, which can be understood by those skilled in this art.

The auxiliary capacitor $C_{A7}$ includes a first electrode E1 and a second electrode E2. Multiple switches SW11 and SW12 are each arranged between two terminals from among the first terminal 221, the second terminal 222, and the first electrode E1 and the second electrode E2 of the auxiliary capacitor $C_{A7}$. Specifically, the first switch SW11 is arranged between the first terminal 221 and the first electrode of the auxiliary capacitor $C_{A7}$. The second switch SW12 is arranged between the first terminal 221 and the second terminal 222. The second electrode E2 of the auxiliary capacitor $C_{A7}$ is connected to the second terminal 222. The controller 224 switches on and off the first switch SW11 and the second switch SW12 in a complementary manner in synchronization with the current $I_{TX}$ that flows through the radiation coil 200.

In a case in which the driving power supply 204 is configured as a set of the power supply 10 and the automatic tuning assist circuit 30 or a set of the power supply 10 and the automatic tuning assist circuit 80, the controller 224 switches on and off the switches SW11 and the SW12 in synchronization with the driving voltage $V_{DRV}$ with a predetermined phase difference $\theta_{REF}$ with respect to the driving voltage $V_{DRV}$.

Figure 32:
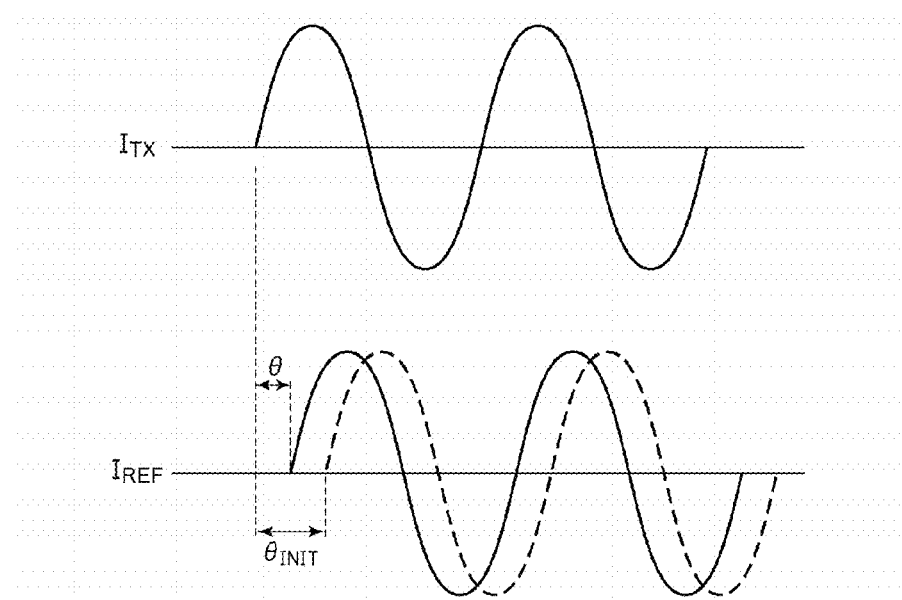
FIG. 32 is a waveform diagram showing the operation of the wireless power transmitting apparatus according to the third embodiment.

The above is the configuration of the wireless power transmitting apparatus 2f according to the third embodiment. Next, description will be made regarding the operation thereof. FIG. 32 is a waveform diagram showing the operation of the wireless power transmitting apparatus 2f according to the third embodiment.

The driving power supply 204 controls the phase of the coil current $I_{TX}$ that flows through the radiation coil 200 so as to provide a resonant state. This operation is performed in the same manner as described in the first and second embodiments. Description will be made below regarding the operation directing attention to the reflector coil 202 and the first phase control circuit 206. First, the radiation coil 200 generates a magnetic field that serves as an interlinkage magnetic flux between the radiation coil 200 and the reflector coil 202, which generates an induced current $I_{REF}$ that flows through the reflector coil 202. Assuming that the automatic tuning assist circuit 220 does not operate, there is an initial phase difference $\theta_{INIT}$ between the coil current $I_{TX}$ and the coil current $I_{REF}$, as indicated by the broken line in FIG. 32. In this state in which the coil current $I_{REF}$ flows through the reflector coil 202, the reflector coil 202 also generates a magnetic field. That is to say, the reflector coil 202 functions as a reflector that reflects the magnetic field emitted from the radiation coil 200.

In this stage, the switches SW11 and SW12 of the automatic tuning assist circuit 220 included in the first phase control circuit 206 are each turned on and off with a predetermined phase $\theta_{REF}$, which generates a voltage $V_{CA7}$ at the auxiliary capacitor $C_{A7}$ according to the phase $\theta_{REF}$. In this case, the operation mechanism of the automatic tuning assist circuit 220 is the same as that described in the first embodiment.

With such an arrangement, the voltage $V_{CA7}$ that develops at the auxiliary capacitor $C_{A7}$ is applied to a series resonance circuit including the reflector coil 202 and the tuning capacitor 208. This shifts the phase difference between the two coil currents $I_{TX}$ and $I_{REF}$ from the initial value $\theta_{INIT}$ according to the voltage $V_{CA7}$. That is to say, by controlling the switching phase $\theta_{REF}$ of the switches SW11 and SW12, such an arrangement is capable of adjusting the voltage $V_{CA7}$. Thus, such an arrangement allows the phase difference $\theta$ between the currents $I_{TX}$ and $I_{REF}$ to be controlled as desired.

Figure 33A:
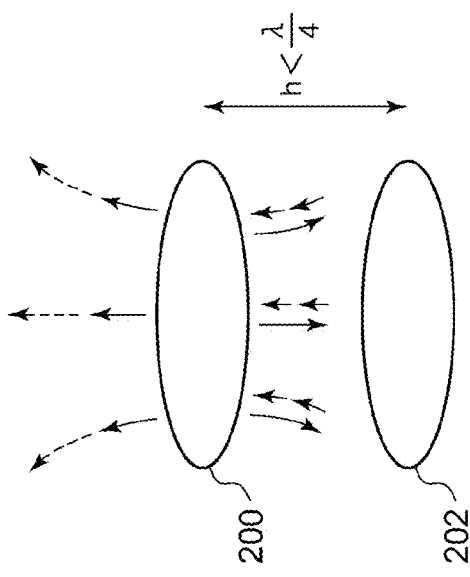
FIG. 33A is a schematic diagram showing the magnetic field generated by a radiation coil and a reflector coil.
Figure 33B:
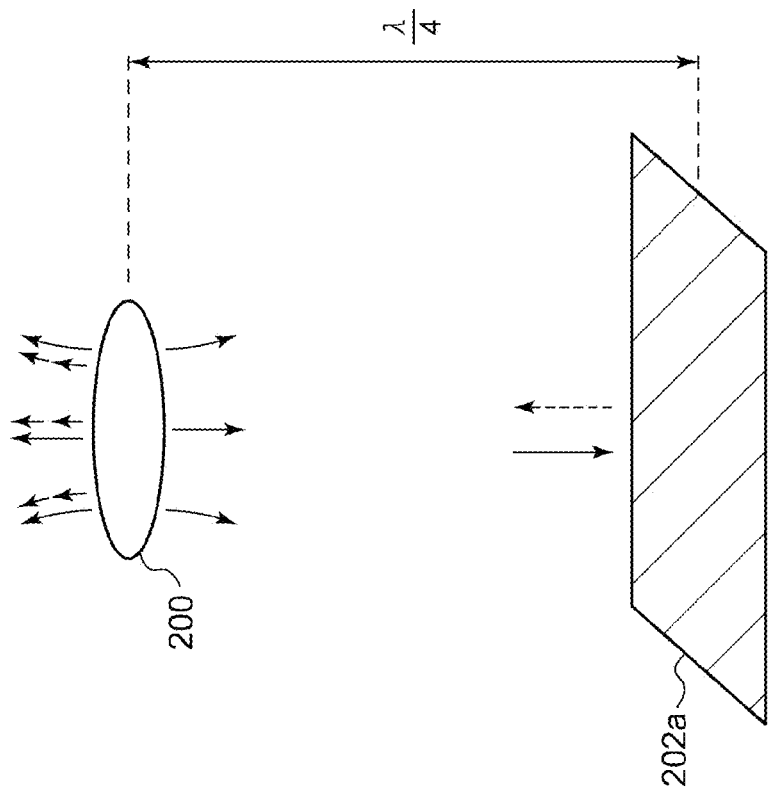
FIG. 33B is a schematic diagram showing the magnetic field generated by the radiation coil and a grounded conductor.

FIG. 33A is a schematic diagram showing the magnetic field generated by the radiation coil 200 and the reflector coil 202. FIG. 33B is a schematic diagram showing the magnetic field generated by the radiation coil 200 and a grounded conductor. The operation of the wireless power transmitting apparatus 2f can be described by analogy with a so-called Yagi-Uda antenna.

In the drawing, the magnetic field generated by the radiation coil 200 is indicated by the solid line, and the magnetic field generated by the reflector coil 202 is indicated by the broken line. Controlling the phase difference between the currents $I_{TX}$ and $I_{REF}$ is none other than controlling the phase of the magnetic field generated by the radiation coil 200 and the phase of the magnetic field generated by the reflector coil 202. Thus, in a state in which the phase difference is optimized, on the side further above the coil face of the reflector coil 202, positive interference occurs between the magnetic field generated by the radiation coil 200 and the magnetic field generated by the reflector coil 202. In contrast, in the space between the radiation coil 200 and the reflector coil 202, negative interference occurs between them. This allows the magnetic field (electric field or electromagnetic field) generated by the radiation coil 200 to be damped on the one side thereof.

The advantage of the wireless power transmitting apparatus 2f can be clearly understood in comparison with a comparison technique shown in FIG. 33B. As shown in FIG. 33B, let us consider an arrangement in which a grounded conductor 202a is arranged in parallel with the radiation coil 200. With such an arrangement, the grounded conductor 202a reflects the magnetic field generated by the radiation coil 200. The magnetic field reflected by the grounded conductor 202a has a phase that is the reverse of that of the incident magnetic field. Thus, with such a comparison technique shown in FIG. 33B, in order to provide positive interference between the emitted magnetic field generated by the radiation coil 200 and the reflected magnetic field that is reflected by the grounded conductor 202a on the side above the radiation coil 200, the distance between the radiation coil 200 and the grounded conductor 202a should be on the order of ¼ the wavelength $\lambda$. For example, a magnetic field having a frequency of 10 MHz has a wavelength $\lambda$ of 30 m. Thus, with such an arrangement, the distance between the radiation coil 200 and the grounded conductor 202a should be $\lambda/4=7.5$ m. It is very difficult to provide such a configuration in typical environments in which the wireless power transmitting apparatus 2f is employed.

In contrast, with the wireless power transmitting apparatus 2f according to the embodiment, such an arrangement is capable of controlling as desired the phase difference between the currents $I_{TX}$ and $I_{REF}$ that respectively flow through the radiation coil 200 and the reflector coil 202. In other words, such an arrangement is capable of controlling as desired the phase of the magnetic field generated by the reflector coil 202. Thus, by optimizing the phase difference $\theta$, such an arrangement allows the distance h between the radiation coil 200 and the reflector coil 202 to be smaller than $\lambda/4$.

The wireless power transmitting apparatus 2f has an advantage of providing very stable operation even if a user terminal, a piece of metal, or a piece of dielectric material approaches the wireless power transmitting apparatus 2f. If a user terminal approaches the radiation coil 200, or otherwise if a piece of metal or dielectric material approaches the radiation coil 200, this disturbs the resonant state of the radiation coil 200. However, the automatic tuning assist circuit included in the driving power supply 204 re-adjusts the phase of the coil current $I_{TX}$ so as to provide the resonant state. In this stage, the automatic tuning assist circuit 220 included in the first phase control circuit 206 adjusts the phase of the coil current $I_{REF}$ according to the coil current $I_{TX}$. This allows the phase difference between the coil currents $I_{REF}$ and $I_{TX}$ to be maintained at a constant level.

Description has been made regarding the present invention with reference to the third embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Figure 34:
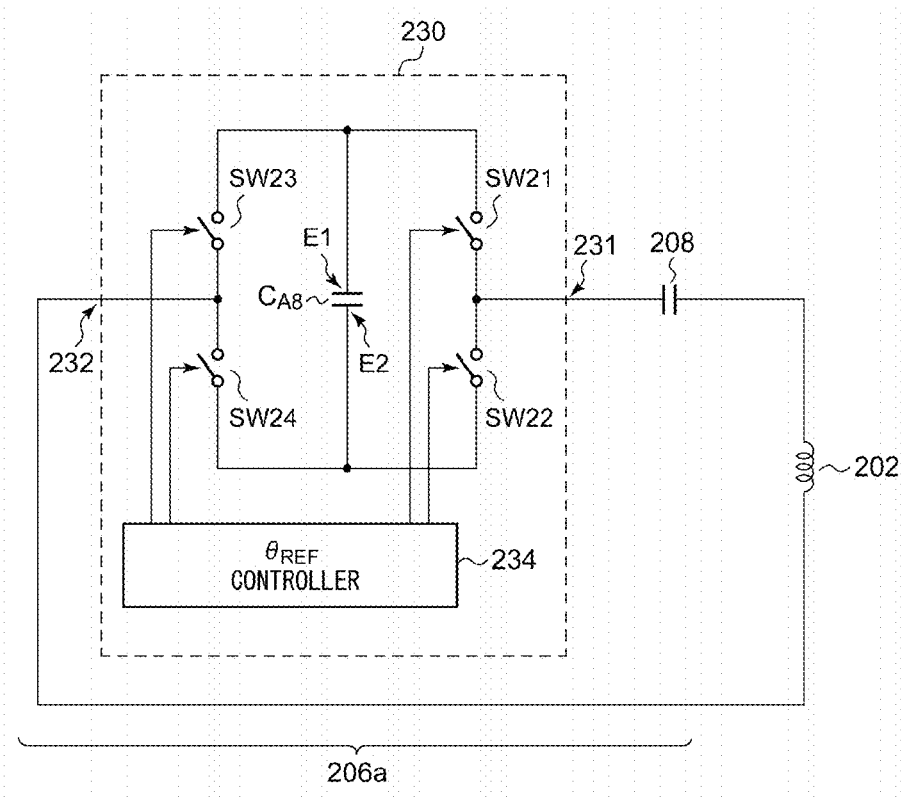
FIG. 34 is a circuit diagram showing a configuration of a first phase control circuit according to a first modification.

Description has been made in the embodiment regarding an arrangement in which the first phase control circuit 206 includes the automatic tuning assist circuit 220 having the configuration according to the first embodiment. However, the present invention is not restricted to such an arrangement. Also, the first phase control circuit 206 may include the automatic tuning assist circuit 220 described in the second embodiment. FIG. 34 is a circuit diagram showing a configuration of a first phase control circuit 206a according to a first modification.

The first phase control circuit 206a includes an automatic tuning assist circuit 230 coupled in series with a circuit comprising the reflector coil 202 and the tuning capacitor 208. The automatic tuning assist circuit 230 has the same configuration as those of the automatic tuning assist circuit 80 shown in FIG. 22 and the automatic tuning assist circuit 90 shown in FIG. 26. Specifically, the automatic tuning assist circuit 230 includes a first terminal 231, a second terminal 232, an auxiliary capacitor $C_{A8}$, multiple switches SW21 through SW24, and a controller 234.

Specifically, the switch SW21 is arranged between the first terminal 231 and a first electrode E1 of the auxiliary capacitor $C_{A8}$. The switch SW22 is arranged between the first terminal 231 and a second electrode E2 of the auxiliary capacitor $C_{A8}$. The switch SW23 is arranged between the second terminal 232 and the first electrode E1 of the auxiliary capacitor $C_{A8}$. The switch SW24 is arranged between the second terminal 232 and the second electrode E2 of the auxiliary capacitor $C_{A8}$. Various modifications described in the second embodiment are applicable to the automatic tuning assist circuit 230, which can be clearly understood by those skilled in this art.

With the first modification, such an arrangement provides the same advantages as those in a case in which the automatic tuning assist circuit 220 shown in FIG. 31 is employed.

[Second Modification]

Figure 35:
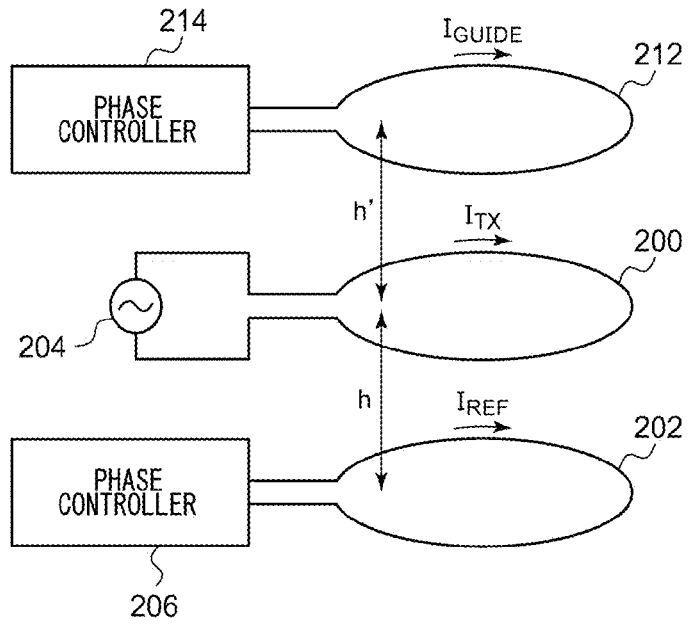
FIG. 35 is a circuit diagram showing a configuration of a wireless power transmitting apparatus according to a second modification.

FIG. 35 is a circuit diagram showing a configuration of a wireless power transmitting apparatus 2g according to a second modification. The wireless power transmitting apparatus 2g further includes a waveguide coil 212 and a second phase control circuit 214 in addition to the configuration of the wireless power transmitting apparatus 2f shown in FIG. 30.

The second phase control circuit 214 controls the phase of the current $I_{GUIDE}$ that flows through the waveguide coil 212 so as to stabilize, to a predetermined value, the phase difference θ' between the current $I_{GUIDE}$ that flows through the waveguide coil 212 and the current $I_{TX}$ that flows through the radiation coil 200. The second phase control circuit 214 may have the same configuration as that of the first phase control circuit 206.

With the wireless power transmitting apparatus 2g, by controlling the phase of the current $I_{GUIDE}$ that flows through the waveguide coil 212, such an arrangement allows the waveguide coil 212 to function as an element that corresponds to a waveguide antenna configured as a Yagi-Uda antenna.

[Third Modification]

Figure 36:
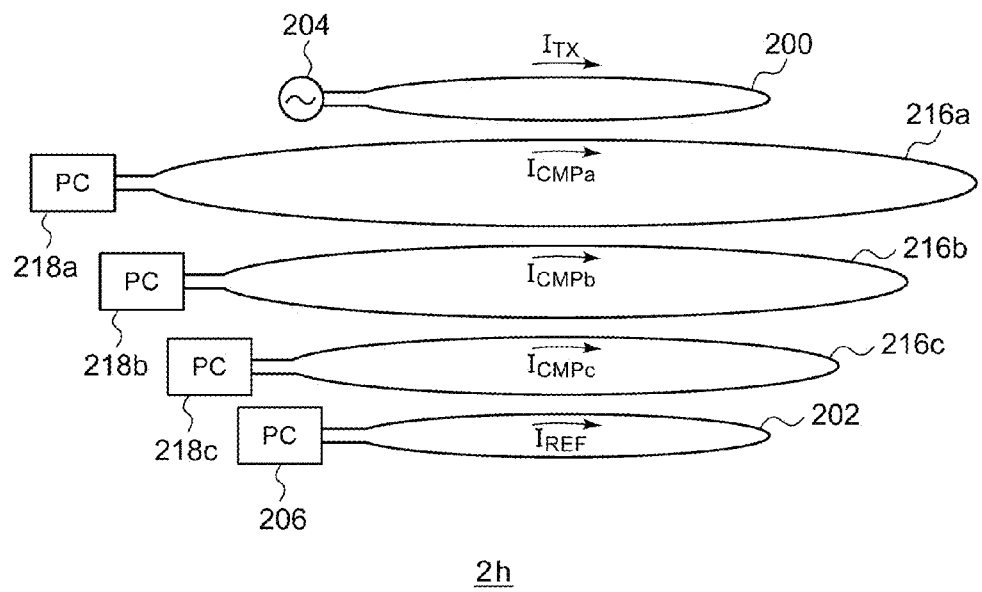
FIG. 36 is a circuit diagram showing a configuration of a wireless power transmitting apparatus according to a third modification.

FIG. 36 is a circuit diagram showing a configuration of a wireless power transmitting apparatus 2h according to a third modification. The wireless power transmitting apparatus 2h further includes at least one space compression coil 216 and a third phase control circuit 218 provided for each space compression coil 216. FIG. 36 shows an arrangement including three space compression coils 216.

The space compression coils 216a through 216c are arranged between the radiation coil 200 and the reflector coil 202. The space compression coils 216a through 216c are each configured such that, as the distance between it and the radiation coil 200 becomes smaller, its coil diameter should be greater, and as the distance between it and the reflector coil 202 should be smaller, its coil diameter becomes smaller. The third phase control circuits 218a through 218c are provided to the space compression coils 216a through 216c, respectively. Each third phase control circuit 218 controls the current $I_{CMP}$, that flows through the corresponding space compression coil 216 so as to stabilize, to a predetermined value, the phase difference between the current $I_{CMP}$ that flows through the corresponding space compression coil 216 and the current $I_{TX}$ that flows through the radiation coil 200. The third phase control circuit 218 may preferably have the same configuration as that of the first phase control circuit 206.

With the wireless power transmitting apparatus 2h, by optimizing the respective phases of the currents $I_{CMPa}$ through $I_{CMPc}$ that respectively flow through the space compression coils 216a through 216c, such an arrangement is capable of appropriately canceling out, with higher efficiency, the magnetic field generated by the radiation coil 200 emitted in a space between the radiation coil 200 and the reflector coil 202. As a result, such an arrangement allows the distance between the radiation coil 200 and the reflector coil 202 to be further reduced.

Also, such a space compression coil may be arranged between the radiation coil 200 and the waveguide coil 212. This allows the distance between the radiation coil 200 and the waveguide coil 212 to be reduced.

[Fourth Modification]

Figure 37:
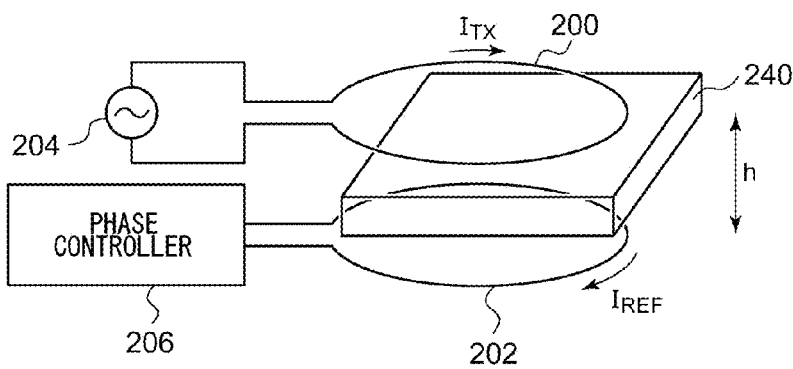
FIG. 37 is a circuit diagram showing a configuration of a wireless power transmitting apparatus according to a fourth modification.

FIG. 37 is a circuit diagram showing a configuration of a wireless power transmitting apparatus 2i according to a fourth modification. The wireless power transmitting apparatus 2i further includes a magnetic plate 240 in addition to the configuration of the wireless power transmitting apparatus 2f shown in FIG. 30.

In the interior of the magnetic plate 240 having a relative magnetic permeability μ, the electromagnetic wave speed ratio of an electromagnetic wave becomes $1/\sqrt{\mu}$. Thus, by interposing a material having a large relative magnetic permeability μ between the radiation coil 200 and the reflector coil 202, such an arrangement allows the distance between the radiation coil 200 and the reflector coil 202 to be further reduced.

The magnetic plate 240 may be arranged between the radiation coil 200 and the waveguide coil 212, between the radiation coil 200 and the space compression coil 216, between the space compression coils 216, or between the space compression coil 216 and the reflector coil 202.

[Fifth Modification]

Figure 38:
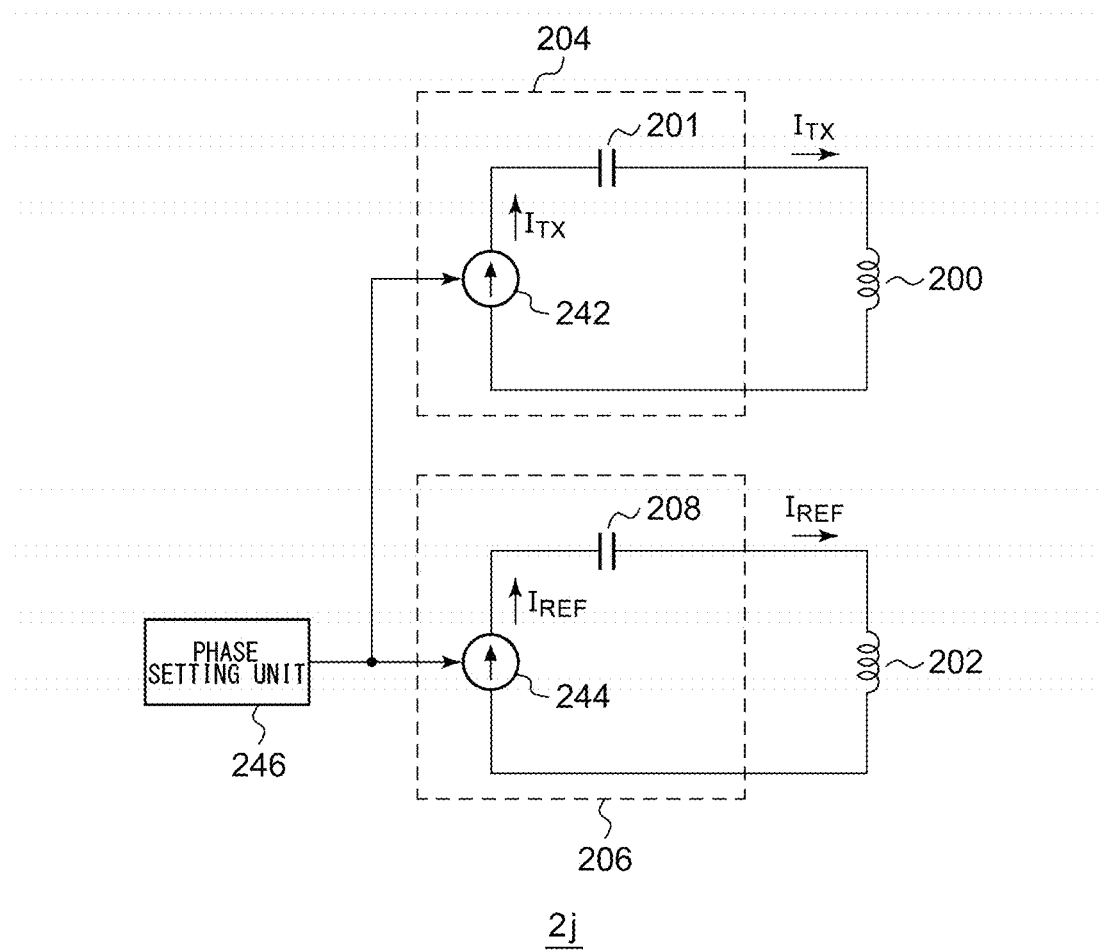
FIG. 38 is a circuit diagram showing a configuration of a wireless power transmitting apparatus according to a fifth modification.

FIG. 38 is a circuit diagram showing a configuration of a wireless power transmitting apparatus 2j according to a fifth modification. In the third embodiment, the driving power supply 204 can be regarded as a current source which is capable of controlling the phase of the current $I_{TX}$ that flows through the radiation coil 200. Similarly, the first phase control circuit 206 can be regarded as a current source which is capable of controlling the phase of the current $I_{REF}$ that flows through the reflector coil 202. In the wireless power transmitting apparatus 2j shown in FIG. 38, the driving power supply 204 includes a current source 242 and a resonance capacitor 201. Furthermore, the first phase control circuit 206 includes a tuning capacitor 208 and a current source 244. The current sources 242 and 244 are configured to be capable of controlling the phases of the currents $I_{TX}$ and $I_{REF}$, respectively, as desired. The phase setting unit 246 controls the current sources 242 and 244 so as to set the phase difference between the currents $I_{TX}$ and $I_{REF}$ to an optimum value.

Such a modification provides the same advantages as those provided by other kinds of wireless power transmitting apparatuses 2. It should be noted that the second phase control circuit 214 or the third phase control circuit 218 may be configured using a current source, in the same way as the first phase control circuit 206.

While the preferred embodiments of the present invention have been described using specific terms, such description is for illustrative purposes only, and it is to be understood that changes and variations may be made without departing from the spirit or scope of the appended claims.

What is claimed is:

1. A wireless power transmitting apparatus which transmits an electric power signal comprising any one from among an electric field, a magnetic field, and an electromagnetic field to a wireless power receiving apparatus, the wireless power transmitting apparatus comprising:
   a radiation coil;
   a reflector coil having its coil face which is essentially parallel to a coil face of the radiation coil and arranged at a distance from the radiation coil;
   a driving power supply that supplies a driving current to the radiation coil; and
   a first phase control circuit that controls the phase of a current that flows through the reflector coil so as to stabilize the phase difference between the current that flows through the reflector coil and a current that flows through the radiation coil, thereby the electric power signal generated by the radiation coil is damped on one side of the radiation coil, wherein the first phase control circuit comprises an automatic tuning assist circuit coupled in series with the reflector coil,
   and wherein the automatic tuning assist circuit comprises:
      a first terminal;
      a second terminal;
      N (N represents an integer) auxiliary capacitors each having a first electrode and a second electrode;
      a plurality of switches each of which is arranged between two terminals from among the first terminal, the second terminal, and terminals of the N auxiliary capacitors; and
      a controller that switches on and off each one of the plurality of switches in synchronization with the current that flows through the radiation coil.

2. The wireless power transmitting apparatus according to claim 1, wherein the driving power supply comprises a current source that supplies a driving current having a predetermined phase to the radiation coil.

3. The wireless power transmitting apparatus according to claim 1, further comprising a magnetic plate interposed between the radiation coil and the reflector coil.

4. A wireless power supply system comprising:
   the wireless power transmitting apparatus according to claim 1; and
   a wireless power receiving apparatus that receives an electric power signal from the wireless power transmitting apparatus.

5. A wireless power transmitting apparatus which transmits an electric power signal comprising any one from among an electric field, a magnetic field, and an electromagnetic field to a wireless power receiving apparatus, the wireless power transmitting apparatus comprising:
   a radiation coil;
   a reflector coil having its coil face which is essentially parallel to a coil face of the radiation coil and arranged at a distance from the radiation coil;
   a driving power supply that supplies a driving current to the radiation coil; and
   a first phase control circuit that controls the phase of a current that flows through the reflector coil so as to stabilize the phase difference between the current that flows through the reflector coil and a current that flows through the radiation coil, thereby the electric power signal generated by the radiation coil is damped on one side of the radiation coil,
   wherein the first phase control circuit comprises a current source that supplies an AC current having a predetermined phase to the reflector coil.

6. A wireless power transmitting apparatus which transmits an electric power signal comprising any one from among an electric field, a magnetic field, and an electromagnetic field to a wireless power receiving apparatus, the wireless power transmitting apparatus comprising:
   a radiation coil;
   a reflector coil having its coil face which is essentially parallel to a coil face of the radiation coil and arranged at a distance from the radiation coil;
   a driving power supply that supplies a driving current to the radiation coil; and
   a first phase control circuit that controls the phase of a current that flows through the reflector coil so as to stabilize the phase difference between the current that flows through the reflector coil and a current that flows through the radiation coil, thereby the electric power signal generated by the radiation coil is damped on one side of the radiation coil,
   wherein the driving power supply comprises:
      an automatic tuning assist circuit coupled in series with the radiation coil; and
      a voltage source that applies an AC driving voltage across both terminals of a circuit that comprises the radiation coil and the automatic tuning assist circuit,
   and wherein the automatic tuning assist circuit comprises:
      a first terminal;
      a second terminal;
      N (N represents an integer) auxiliary capacitors each having a first electrode and a second electrode;
      a plurality of switches each of which is arranged between two terminals from among the first terminal, the second terminal, and terminals of the N auxiliary capacitors; and
      a controller that switches on and off each one of the plurality of switches in synchronization with the driving voltage with a predetermined phase difference with respect to the driving voltage.

7. A wireless power transmitting apparatus which transmits an electric power signal comprising any one from among an electric field, a magnetic field, and an electromagnetic field to a wireless power receiving apparatus, the wireless power transmitting apparatus comprising:
   a radiation coil;
   a reflector coil having its coil face which is essentially parallel to a coil face of the radiation coil and arranged at a distance from the radiation coil;

a driving power supply that supplies a driving current to the radiation coil; and a first phase control circuit that controls the phase of a current that flows through the reflector coil so as to stabilize the phase difference between the current that flows through the reflector coil and a current that flows through the radiation coil, thereby the electric power signal generated by the radiation coil is damped on one side of the radiation coil, a waveguide coil provided to the radiation coil at a distance from the radiation coil on a side opposite to the reflector coil; and a second phase control circuit that controls the phase of a current that flows through the waveguide coil so as to stabilize the phase difference between the current that flows through the waveguide coil and a current that flows through the radiation coil.

8. The wireless power transmitting apparatus according to claim 7, wherein the second phase control circuit comprises an automatic tuning assist circuit coupled in series with the waveguide coil, and wherein the automatic tuning assist circuit comprises:
a first terminal;
a second terminal;
N (N represents an integer) auxiliary capacitors each having a first electrode and a second electrode;
a plurality of switches each of which is arranged between two terminals from among the first terminal, the second terminal, and terminals of the N auxiliary capacitors; and
a controller that switches on and off each one of the plurality of switches in synchronization with the current that flows through the radiation coil.

9. The wireless power transmitting apparatus according to claim 7, wherein the second phase control circuit comprises a current source that supplies an AC current having a predetermined phase to the waveguide coil.

10. A wireless power transmitting apparatus which transmits an electric power signal comprising any one from among an electric field, a magnetic field, and an electromagnetic field to a wireless power receiving apparatus, the wireless power transmitting apparatus comprising:
a radiation coil;
a reflector coil having its coil face which is essentially parallel to a coil face of the radiation coil and arranged at a distance from the radiation coil;
a driving power supply that supplies a driving current to the radiation coil; and
a first phase control circuit that controls the phase of a current that flows through the reflector coil so as to stabilize the phase difference between the current that flows through the reflector coil and a current that flows through the radiation coil, thereby the electric power signal generated by the radiation coil is damped on one side of the radiation coil, generated by the radiation coil is damped on one side of the radiation coil;
at least one space compression coil arranged between the radiation coil and the reflector coil; and
at least one third phase control circuit provided for each of the at least one space compression coils, wherein each third phase control circuit controls the phase of a current that flows through the corresponding space compression coil so as to stabilize the phase difference between the current that flows through the space compression coil and a current that flows through the radiation coil.

11. The wireless power transmitting apparatus according to claim 10, wherein the third phase control circuit comprises an automatic tuning assist circuit coupled in series with the corresponding space compression coil, and wherein the automatic tuning assist circuit comprises:
a first terminal;
a second terminal;
N (N represents an integer) auxiliary capacitors each having a first electrode and a second electrode;
a plurality of switches each of which is arranged between two terminals from among the first terminal, the second terminal, and terminals of the N auxiliary capacitors; and
a controller that switches on and off each one of the plurality of switches in synchronization with the current that flows through the radiation coil.

12. The wireless power transmitting apparatus according to claim 10, wherein the third phase control circuit comprises a current source that supplies an AC current having a predetermined phase to the corresponding space compression coil.

* * * * *